United States Patent
May

(10) Patent No.: US 10,686,132 B2
(45) Date of Patent: Jun. 16, 2020

(54) FORMULATIONS COMPRISING ORGANIC AT LEAST TWO SEMICONDUCTING COMPOUNDS AND AT LEAST TWO SOLVENTS

(71) Applicant: Merck Patent GmbH, Darmstadt (DE)

(72) Inventor: Philip Edward May, Sidcup (GB)

(73) Assignee: Merck Patent GmbH, Darmstadt (DE)

( * ) Notice: Subject to any disclaimer, the term of this patent is extended or adjusted under 35 U.S.C. 154(b) by 131 days.

(21) Appl. No.: 15/766,049

(22) PCT Filed: Sep. 15, 2016

(86) PCT No.: PCT/EP2016/001551
§ 371 (c)(1),
(2) Date: Apr. 5, 2018

(87) PCT Pub. No.: WO2017/059944
PCT Pub. Date: Apr. 13, 2017

(65) Prior Publication Data
US 2019/0115536 A1    Apr. 18, 2019

(30) Foreign Application Priority Data
Oct. 6, 2015 (EP) .................................... 15188654

(51) Int. Cl.
*H01L 51/00* (2006.01)
*H01L 51/50* (2006.01)

(52) U.S. Cl.
CPC ...... *H01L 51/0007* (2013.01); *H01L 51/0035* (2013.01); *H01L 51/0043* (2013.01); *H01L 51/0052* (2013.01); *H01L 51/0056* (2013.01); *H01L 51/0067* (2013.01); *H01L 51/0085* (2013.01); *H01L 51/5016* (2013.01); *H01L 51/5048* (2013.01); *H01L 51/5056* (2013.01); *H01L 51/5072* (2013.01); *H01L 51/5092* (2013.01); *H01L 51/5096* (2013.01); *H01L 2251/552* (2013.01)

(58) Field of Classification Search
None
See application file for complete search history.

(56) References Cited

U.S. PATENT DOCUMENTS

| 6,994,893 B2 * | 2/2006 | Spreitzer ................ C09K 11/06 427/466 |
| 7,704,785 B2 * | 4/2010 | Steiger .................. C09K 11/025 252/301.16 |
| 2006/0147615 A1 | 7/2006 | Park |
| 2014/0230900 A1 | 8/2014 | Cull et al. |

OTHER PUBLICATIONS

International Search Report for PCT/EP2016/001551 dated Feb. 12, 2016.
Written Opinion of the International Searching Authority for PCT/EP2016/001551 dated Feb. 12, 2016.

* cited by examiner

*Primary Examiner* — Michelle Mandala
(74) *Attorney, Agent, or Firm* — Faegre Drinker Biddle & Reath LLP

(57) ABSTRACT

The invention relates to formulations comprising at least two organic semiconducting compounds and at least two solvents, methods for their preparation, their use for the preparation of electronic devices and electronic devices comprising organic semiconducting materials.

18 Claims, 1 Drawing Sheet

FORMULATIONS COMPRISING ORGANIC AT LEAST TWO SEMICONDUCTING COMPOUNDS AND AT LEAST TWO SOLVENTS

CROSS-REFERENCE TO RELATED APPLICATIONS

This application is a national stage application (under 35 U.S.C. § 371) of PCT/EP2016/001551, filed Sep. 15, 2016, which claims benefit of European Application No. 15188654.6, filed Oct. 6, 2015, both of which are incorporated herein by reference in their entirety.

The present invention relates, inter alia, to formulations, to methods for their preparation, and the use of said formulations for the preparation of electronic or opto-electronic devices.

BACKGROUND OF THE INVENTION

Organic electronics, such as organic light-emitting diodes (OLEDs), organic field-effect transistors (OFETs), organic photovoltaic cells (OPVs), organic light-emitting electrochemical cells (OLECs), photo detectors, and all-polymer integrated electronic circuits, have drawn much attention in the past two decades, because they are versatile in material design, light-weight, and suitable for large area application. These organic electronic devices usually comprise a multilayer structure. Hereby it is crucial to deposit the active organic materials on the nano- to mesoscopic scale on a substrate. In addition, the formation of organic multilayer structures has to occur without affecting the underlying layers in an uncontrolled way. The development of cost effective technologies for the mass production of organic electronics will have a decisive role for their competitiveness as compared to current technologies employed. Cost reduction for the mass production is therefore a mandatory prerequisite for the commercial success of organic electronics. In order to achieve this goal solution based deposition methods could provide a solution. However, current technologies do not offer a competitive way to adequately prepare multilayered structures for organic electronics, particularly if they comprise small molecules. This is due to the fact that layers that have already been deposited may be, at least in part, dissolved or washed away when another layer is deposited on it.

In the case of OLEDs, the formation of patterned light emitting layers is an important but difficult step in the production of electroluminescent devices. For example, the formation of separate red, green and blue patterned emitter layers is typically required in the production of electroluminescent full color display devices. Vacuum evaporation (e.g., using a shadow mask) is the most common technique to form each of the patterned layers. However, vacuum evaporation techniques have a couple of drawbacks which may significantly inhibit the commercial development of multilayer structures comprising organic materials such as OLEDs. These techniques are rather complex in terms of equipment needed. In particular for large format displays, other methods for manufacturing patterned layers are needed. Methods based on depositing materials from solution are especially desirable for their expected compatibility with large scale device fabrication.

The possible technologies are, for example, ink-jet printing, dip coating, spin coating, letter-press printing, screen printing, doctor blade coating, and slot-die coating etc. Ink-jet printing is particularly preferred as it allows high resolution displays to be prepared.

The prior art provides compositions being useful in order to process low molecular weight organic light emitting and charge transporting materials. However, it is a permanent desire to improve the performance of the OLED layer, such as efficiency, lifetime and sensitivity regarding oxidation or water.

Currently soluble OLED inks are prepared and processed in multiple layers, initially PEDOT is applied and then dried and baked to remove alt water. The next layer to be printed is the HTL (Hole transport layer) this is dried and baked (optionally crosslinking).

Finally the EML (Emission Material Layer) is applied and baked. The HTL is frequently a crosslinkable material this is to ensure that there is no intermixing of the HTL and EML layers. This approach makes it difficult to be able to change the HTL dependant on the colour. As a singlet blue is frequently used then this ideally necessitates a different HT layer in order to maximise the lifetime. Therefore, at present the process using conventional inks is very complicated and expensive.

In addition thereto, the formulation should enable a low-cost and easy printing process. The printing process should allow a high quality printing at high speed.

It is therefore desirable to have improved formulations comprising an OSC that are suitable for the preparation of OE devices, especially thin film transistors, diodes, OLED displays and OPV cells, which allow the manufacture of high efficient OE devices having a high performance, a long lifetime and a low sensitivity against water or oxidation. One aim of the present invention is to provide such improved formulations. Another aim is to provide improved methods of preparing an OE device from such formulations. Another aim is to provide improved OE devices obtained from such formulations and methods. Further aims are immediately evident to the person skilled in the art from the following description.

BRIEF SUMMARY OF THE INVENTION

Figure 1:
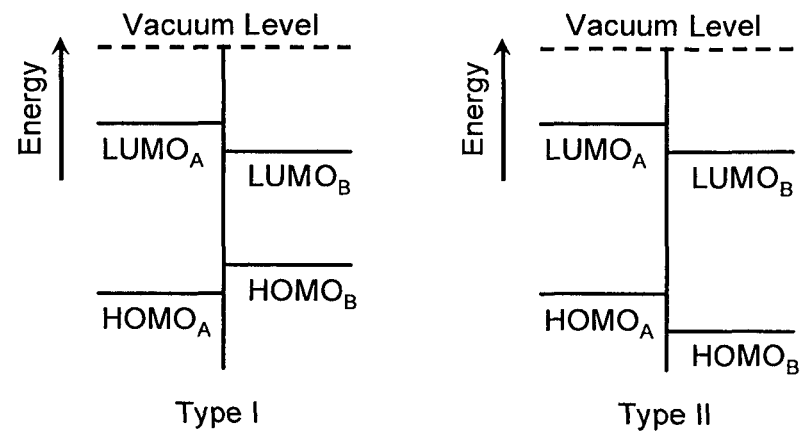
FIG. 1 shows a type I and type II heterojunction.

It is an object of the present invention to overcome the problems known in the prior art. In particular, it is an object of the present invention to provide formulations, methods for their preparations and their use for the preparation of electronic and opto-electronic devices with multilayer structure.

Surprisingly it has been found that these aims can be achieved, and the above-mentioned problems can be solved, by providing methods, materials and devices as claimed in the present invention, especially by providing a process for preparing an OE device using a formulation of the present invention.

The present formulations increase productivity and allow improved formulation flexibility. Whilst it is technically possible to print different HTL and different colours, this slows down production time and increases the number of print heads required.

DETAILED DESCRIPTION OF THE INVENTION

Surprisingly, it has been found that formulations comprising at least two organic semiconducting compounds and at least two organic semiconducting compounds can be formed being able to produce different layers of devices with a multilayer structure. The formulations enable the use of simple deposition techniques from solution for preparing at least two layers in an easy manner. The formulations according to the present invention are particularly important and useful for the preparation of opto-electronic devices such as OLEDs, solar cells, and photovoltaic cells.

The present formulation can be realized as solution and/or emulsion. An emulsion comprises, in addition to organic semiconducting materials as outlined below in the present invention, at least two solvents having limited miscibility. The discontinuous phase of the formulation can exist in the form of a nanodroplet in the case of an emulsion. Furthermore, the formulation can form a solution of mixed solvents and solved organic semiconducting materials.

The present invention relates to an formulation, comprising a first organic semiconducting compound (OSC-1), a second organic semiconducting compound (OSC-2) and a first organic solvent (S-1) and a second organic solvent (S-2), characterized in that the first organic solvent (S-1) exhibits a lower boiling point than the second organic solvent (S-2) and wherein the first organic semiconducting compound (OSC-1) has a high solubility in the first organic solvent (S-1) and the first organic semiconducting compound (OSC-1) has a low solubility in the second organic solvent (S-2).

Preferably, the first organic semiconducting compound (OSC-1) has a solubility in the second organic solvent (S-2) of at most 5 g/l, more preferably at most 3 g/l and most preferably at most 1 g/l and ideally be orthogonal.

Preferably, first organic semiconducting compound (OSC-1)has a solubility in the first organic solvent (S1) of at least 10 g/l, more preferably at least 20 g/l and most preferably at least 40 g/l.

In a preferred embodiment of the present invention, the second organic semiconducting compound (OSC-2) has a low solubility in the first organic solvent (S-1).

Furthermore, the second organic semiconducting compound (OSC-2) preferably has a solubility in the first organic solvent (S-1) of at most 5 g/l, more preferably of at most 3 g/l and most preferably of at most 1 g/l and ideally be orthogonal.

According to a preferred aspect of the present invention, the second organic semiconducting compound (OSC-2) has a high solubility in the second solvent. Perferably, the second organic semiconducting compound (OSC-2) has a solubility in the second organic solvent (S-2) of at least 10 g/l, more preferably at least 20 g/l and most preferably at least 40 g/l.

In another preferred embodiment the said mixture of at least two organic solvents may comprise 2, 3, 4, 5 or more organic solvents.

The highest boiling solvent has a boiling point or sublimation temperature of <400° C., especially ≤350° C., more preferably ≤300° C., most preferably 250° C., at the pressure employed, very preferably at atmospheric pressure (1013 hPa). Evaporation can also be accelerated e.g. by applying heat and/or reduced pressure.

Further preferably the boiling point of the lowest boiling solvent of the solvent blend, is at least 130° C., more preferably at least 150° C. at atmospheric pressure (1013 hPa).

According to a special embodiment of the present invention, the formulation comprises mixture of solvents having different boiling points and the boiling point of the solvent with the lowest boiling point is at least 10° C. below the boiling point of the solvent with the highest boiling point. More preferably, the difference between the boiling point of said first organic solvent (S-1) and the boiling point of said second organic solvent (S-2) is at least 10° C., preferably at least 25° C., more preferably at least 50° C., more preferably at least 75° C. and most preferably at least 100° C.

Preferably, the first organic solvent (S-1) has a boiling point in the range of 100 to 300° C., preferably in the range of 150 to 270, more preferably in the range of 200 to 250° C.

Preffered formulation comprises a second organic solvent (S-2) having a boiling point in the range of 200 to 350° C., preferably in the range of 240 to 320, more preferably in the range of 250 to 300° C.

According to a preferred embodiment of the present invention, the first organic solvent (S-1) has a viscosity of at most 15 mPas and preferably at most 10 mPas and most preferably at most 5 mPas. Preferably, the second organic solvent (S-2) has a viscosity of at most 15 mPas and preferably at most 10 mPas and most preferably at most 5 mPas. The viscosity is determined at a temperature of 25° C. by measuring on AR-G2 rheometer manufactured by TA Instruments. This measurement can be done over a shear range of 10 to 1000 $s^{-1}$ using 40 mm parallel plate geometry. Viscosity is taken as an average reading between 200 $s^{-1}$-800 $s^{-1}$.

The solvents can generally be selected from any chemical class that meets the physical criteria mentioned above, including, but not limited to, aliphatic or aromatic hydrocarbons, amines, thiols, amides, esters, ethers, polyethers, alcohols, diols and polyols. Preferably, the solvent comprises at least one aromatic and/or heteroaliphatic compound.

Suitable and preferred solvents include for example aromatic hydrocarbons (eg halogenated aromatics) and aromatic hydrocarbons having an alkyl group having 1 to 8 carbon atoms and more preferably 1 to 6 carbon atoms especially toluene, dimethyl benzenes (xylenes), trimethyl benzenes, propyl benzenes, and methyl naphthalenes; and aromatic hydrocarbon compound having a cycloalkyl group, especially cyclopentyl benzene, cyclohexyl benzene and cycloaliphatic compounds.

According to a further embodiment of the present invention, aromatic compounds comprising hetero atoms may be used such as esters, ethers, nitriles or amides. Preferably, these compounds include aromatic alkoxy compunds such as 3-methylanisol, 2-isopropylanisol, 5-methoxyindan, 2-ethoxynaphthalene, 3-phenoxy toluene, aromatic esters such as butylbenzoate, ethylbenzoate. Furthermore, heteroaromatic compounds having at least one O, N or S atom in the aromatic ring are preferred. These compounds include e.g. 2-bromo-3-(bromomethyl)thiophene, 2-methylindole, 6-methyl quinoline and thiophene. Moreover, aromatic compounds having at least two aromatic rings being separated by heteroatoms, such as aromatic ethers being derived from two phenols, such as 3-phenoxy toluene are very preferred.

The solvents can be used as mixture of three or more.

Astonishing improvements can be achieved with mixtures of hydrocarbon aromatic compounds. Preferably, the mixture can comprise at least one aromatic hydrocarbon having an alkyl group having 1 to 8 carbon atoms and at least one aromatic compound comprising hetero atoms, more preferably aromatic ethers.

Preferred first organic solvents (S-1) can comprise Hansen Solubility parameters of $H_d$ in the range of 15.0 to 23.2 $MPa^{0.5}$, $H_p$ in the range of 0.2 to 12.5 $MPa^{0.5}$ and $H_h$ in the range of 0.0 to 20.0 $MPa^{0.5}$. More preferred organic solvents comprise Hansen Solubility parameters of $H_d$ in the range of 15.0 to 23.2 $MPa^{0.5}$, $H_p$ in the range of 0.2 to 10.5 $MPa^{0.5}$ and $H_h$ in the range of 0.0 to 5.0 $MPa^{0.5}$.

Preferred second organic solvents (S-2) can comprise Hansen Solubility parameters of $H_d$ in the range of 16.0 to 23.2 $MPa^{0.5}$, $H_p$ in the range of 0.2 to 12.5 $MPa^{0.5}$ and $H_h$ in the range of 0.0 to 20.0 $MPa^{0.5}$. More preferred organic solvents comprise Hansen Solubility parameters of $H_d$ in the range of 16.0 to 23.2 $MPa^{0.5}$, $H_p$ in the range of 0.2 to 10.5 $MPa^{0.5}$ and $H_h$ in the range of 0.0 to 5.0 $MPa^{0.5}$.

Particular useful organic solvents comprise a surface tension of in the range of 22 to 50 mN/m, especially in the range of 25 to 40 mN/m, and more preferably of in the range of 28 to 37 mN/m.

According to a special aspect of the present invention a mixture of solvents can be used having different surface tensions. Preferably, the mixture can comprise at least one solvent having a surface tension of at most 35 mN/m, especially of at most 30 mN/m and at least one solvent having a surface tension of at least 30, especially of at least 32 mN/m and the difference of the surface tension is at least 1 mN/m, more preferably at least 2 mN/m.

The surface tension can be measured using a FTA (First Ten Angstrom) 1000 contact angle goniometer at 25° C. Details of the method are available from First Ten Angstrom as published by Roger P. Woodward, Ph.D. "Surface Tension Measurements Using the Drop Shape Method". Preferably, the pendant drop method can be used to determine the surface tension.

For the purpose for making a rough estimate, the surface tension can be calculated using the Hansen Solubility Parameters by the formula expounded in Hansen Solubility Parameters: A User's Handbook, Second Edition, C. M. Hansen (2007), Taylor and Francis Group, LLC (HSPiP manual).

Surface tension$=0.0146\times(2.28\times^\delta H_d^2+^\delta H_p^2+^{\delta H}h^2)\times MVol^{0.2}$, where:

$H_d$ refers to Dispersion contribution
$H_p$ refers to Polar contribution
$H_h$ refers to Hydrogen bonding contribution
MVol refers to Molar Volume.

The Hansen Solubility Parameters can be determined according to the Hansen Solubility Parameters in Practice (HSPiP) program ($2^{nd}$ edition) as supplied by Hanson and Abbot et al. Suitable solvents, their Hansen Solubility Parameters, their boiling points are provided in Table 1.

| Name | δD | δP | δH | BPt |
|---|---|---|---|---|
| Isopropyl Benzene (Cumene) | 18.1 | 1.2 | 1.2 | 152 |
| Furfuryl Ethyl Ether | 16.9 | 5.8 | 5.4 | 154 |
| 2-Pinene (dl) | 16.9 | 1.8 | 3.1 | 156 |
| 2-Butyl Furan | 16.7 | 3.9 | 4.1 | 156 |
| 1-Butylcyclopentene | 16.5 | 2.3 | 3.5 | 157 |
| Cis-Hexahydroindane | 16.8 | 0 | 0 | 160 |
| Cyclohexyl Formate | 16.9 | 5.1 | 6 | 163 |
| Propylbenzene | 17.3 | 2.2 | 2.9 | 164 |
| 1,2,3-Trimethylbenzene | 17.7 | 2.8 | 3.1 | 164 |
| Mesitylene | 18 | 0.6 | 0.6 | 165 |
| Benzyl Methyl Ether | 17.7 | 4 | 4.6 | 165 |
| 1,5-Octadien-3-One | 16.6 | 5.6 | 4.4 | 168 |
| Trimethylbenzene | 18 | 1 | 1 | 169 |
| 3-Octen-2-One | 16.5 | 5.3 | 4.1 | 169 |
| 2-Octen-4-One | 16.5 | 5.4 | 4.2 | 169 |
| Phenetole (Ethyl Phenyl Ether) | 18.4 | 4.5 | 4 | 170 |
| Tert-Butylbenzene | 16.6 | 1.5 | 2 | 171 |
| l-Limonene | 16.7 | 1.8 | 3.1 | 171 |
| α-Terpinene | 16.6 | 1.5 | 3.8 | 171 |
| Cyclononane | 16.8 | 0 | 0 | 173 |
| 2,3-Benzofuran (Cumaron) | 18.7 | 5.1 | 5.7 | 174 |
| Dicyclopentadiene | 17.6 | 1.9 | 2.9 | 174 |
| o-Methylanisole | 18.3 | 5.1 | 4.5 | 175 |
| γ-Terpinene | 16.7 | 1.8 | 3.7 | 175 |
| 1,4-Cineole | 16.8 | 3.2 | 2.6 | 175 |
| Dipentene (Dl-Limonene) | 17.2 | 1.8 | 4.3 | 176 |
| Methyl Heptenone | 16.6 | 5.4 | 4.1 | 176 |
| 1,8-Cineole (Eucalyptol) | 16.7 | 4.6 | 3.4 | 177 |
| d-Limonene | 17.2 | 1.8 | 4.3 | 177 |
| Cis-1-Propenylbenzene | 18 | 2.5 | 3.7 | 177 |
| Trans-1-Propenylbenzene | 18 | 2.5 | 3.7 | 177 |
| Phenoxyacetylene | 18.7 | 5.7 | 5.2 | 177 |
| Ether, Ph Enyl Vinyl | 18.1 | 4.8 | 4.9 | 177 |
| Isobutylbenzene | 16.9 | 1.8 | 2.4 | 178 |
| Cineol | 16.6 | 2.7 | 2.5 | 178 |
| Eucalyptol | 16.6 | 2.7 | 2.5 | 178 |
| Ethyl Sorbate | 16.8 | 4.2 | 5.9 | 178 |
| sec-Butylbenzene | 17.1 | 1.5 | 2.1 | 179 |
| m-Methylanisole | 18.2 | 4.7 | 4.3 | 179 |
| p-Methylanisole | 18.2 | 5.3 | 5 | 180 |
| 1-Pentylcyclopentene | 16.6 | 2.2 | 3.5 | 181 |
| Benzofuan, 2,3-Dihydo- | 19.2 | 4.7 | 5.3 | 181 |
| m-Cymene | 17.3 | 1.8 | 1.7 | 182 |
| p-Cymene | 17.3 | 2.3 | 2.4 | 182 |
| m-Diethylbenzene | 17.4 | 2.3 | 2.1 | 182 |
| n-Butylbenzene | 17.4 | 0.1 | 1.1 | 183 |
| 1,2-Diethyl Benzene | 17.7 | 0.1 | 1 | 183 |
| 2-Pentyl Furan | 16.7 | 3.7 | 4 | 183 |
| p-Diethyl Benzene | 18 | 0 | 0.6 | 184 |
| o-Cymene | 17.3 | 2.1 | 1.9 | 184 |
| Indane | 18.8 | 3.4 | 3.3 | 184 |
| Ethyl-O-Xylene | 17.5 | 2.6 | 2.7 | 184 |
| Benzyl Ethyl Ether | 18.4 | 3.8 | 3.8 | 185 |
| Phenyl Isopropyl Ether | 17.5 | 3.9 | 3.8 | 186 |
| Trans-Decahydronaphthalene | 18 | 0 | 0 | 187 |
| 2,5-Heptadien-4-One, 2,6-Dimethyl- | 16.9 | 4.8 | 3.7 | 187 |
| 1-Methyl-2-Propylbenzene | 17.5 | 2.2 | 2.3 | 188 |
| 1-Methyl-3-Propylbenzene | 17.5 | 2 | 2.1 | 188 |
| 1,2,4,5-Tetramethylbenzene | 17.5 | 1.2 | 2.4 | 189 |
| 1-Methyl-4-Propylbenzene | 17.5 | 2.5 | 2.7 | 189 |
| 2-Methylcyclohexylacetate | 16.5 | 3 | 4.4 | 189 |
| 2-Cyclohexyl Propionaldehyde | 16.8 | 5.3 | 4.1 | 191 |
| Phenyl Propyl Ether | 17.6 | 4 | 4.2 | 192 |
| 1-Phenyl-2,2-Dimethylpropane | 16.6 | 1.4 | 2 | 193 |
| Cyclodecane | 16.8 | 0 | 0 | 194 |
| 1-Methyl-3-Tert-Butylbenzene | 16.8 | 1.4 | 1.3 | 194 |
| 4-Isopropyl-2-Cyclohexenone | 17.2 | 5.7 | 3.4 | 194 |
| 2,4-Dimethyl Anisole | 18.1 | 4.6 | 4.4 | 195 |
| 2-Phenyl-2-Methylbutane | 16.7 | 1.4 | 1.6 | 195 |
| 4-Ethyl Anisole | 18 | 4.8 | 4.6 | 195 |
| Cis-Decahydronaphthalene | 17.6 | 0 | 0 | 196 |
| 1-Methyl-4-Tert-Butylbenzene | 16.8 | 1.8 | 1.9 | 196 |
| 1-Methyl-2-Tert-Butyl Benzene | 16.8 | 1.5 | 1.5 | 196 |
| 1,2,3,5-Tetramethylbenzene | 18.6 | 0.5 | 0.5 | 198 |
| 1-Phenyl-3-Methylbutane | 16.9 | 1.7 | 2.4 | 198 |
| 1,2-Dimethyl-4-Isopropylbenzene | 17.2 | 2 | 2 | 199 |
| 3-Phenylpentane | 17 | 1.6 | 2.3 | 200 |
| 1-Phenyl-2-Methylbutane | 17 | 1.4 | 2.1 | 200 |
| Ethyl Cyclohexyl Carboxylate | 16.7 | 3.7 | 4.8 | 200 |
| Menthofuran | 17.2 | 4.6 | 5.6 | 201 |
| 2-Phenylpentane | 17.1 | 1.5 | 2.2 | 201 |
| 1-Methyl-2-Isobutylbenzene | 17.1 | 1.7 | 1.9 | 201 |
| 1-Ethyl-3-Isopropylbenzene | 17.2 | 2.2 | 2.1 | 201 |
| Chroman | 18.8 | 4.3 | 4.7 | 202 |
| 1-Methyl-3-sec-Butylbenzene | 17.3 | 1.3 | 1.4 | 202 |
| 1-Methyl-3-Isobutylbenzene | 17.1 | 1.6 | 1.7 | 202 |
| 1-Ethyl-2-Isopropylbenzene | 17.1 | 1.9 | 1.7 | 202 |

| Name | δD | δP | δH | BPt |
|---|---|---|---|---|
| 1-Methyl-2,4-Diethylbenzene | 17.4 | 2.4 | 2.4 | 203 |
| 1-Methyl-4-Isobutylbenzene | 17.2 | 2.1 | 2.4 | 203 |
| Pentylbenzene | 17.2 | 2.1 | 2.8 | 204 |
| 1-Ethyl-3-Propylbenzene | 17.3 | 1.9 | 1.8 | 204 |
| 1,2-Dimethyl-3-Propylbenzene | 17.4 | 2.2 | 2.3 | 204 |
| 1-Methyl-2-sec-Butylbenzene | 17.2 | 1.4 | 1.6 | 204 |
| 1,3-Dimethyl-4-Propylbenzene | 17.4 | 2.1 | 2.3 | 204 |
| 1-Hexylcyclopentene | 16.5 | 2 | 3.3 | 204 |
| 1,3-Dimethyl-2-Propylbenzene | 17.4 | 2.2 | 2.3 | 204 |
| 3-n-Butyl Toluene | 17.4 | 0.1 | 1 | 205 |
| 1,2,3,4-Tetramethylbenzene | 18.8 | 0.5 | 0.5 | 205 |
| 1-Ethyl-2-Propylbenzene | 17.3 | 2 | 2 | 206 |
| p-n-Butyltoluene | 17.4 | 0.1 | 1 | 207 |
| Isochroman | 19.2 | 4.8 | 4.9 | 207 |
| o-n-Butyltoluene | 17.6 | 0.1 | 1 | 208 |
| Tetrahydronaphthalene | 19.6 | 2 | 2.9 | 208 |
| 1,2-Dihydronaphthalene | 19 | 3.1 | 3.9 | 208 |
| 1,2,3-Trimethyl-4-Ethylbenzene | 17.4 | 1.1 | 2.1 | 208 |
| 1,2,3-Trimethyl-4-Ethylbenzene | 17.4 | 1.1 | 2.1 | 208 |
| Butyl Phenyl Ether | 17.5 | 3.7 | 4.1 | 209 |
| 1-Methyl-3-(Methylethoxy)Benzene | 17.6 | 3.4 | 3 | 210 |
| Isomenthone | 16.9 | 5.2 | 2.4 | 210 |
| 1,4-Dihydronaphthalene | 19.1 | 3.4 | 3.8 | 211 |
| Benzyl Methyl Ketone | 18.1 | 5.7 | 4.6 | 212 |
| Pentamethylbenzene | 17.9 | 1.1 | 1.7 | 213 |
| Phenethyl Isopropyl Ether | 16.9 | 2.9 | 3.1 | 213 |
| Benzyl Acetate | 18.3 | 5.7 | 6 | 214 |
| Cycloundecane | 16.8 | 0 | 0 | 214 |
| p-Tert-Butyl Ethylbenzene | 16.7 | 1.7 | 1.7 | 214 |
| 3-Decen-2-One | 16.5 | 4.6 | 3.8 | 214 |
| m-Diisopropylbenzene | 16.9 | 1.2 | 0.9 | 215 |
| m-Tolyl Acetate | 18.1 | 4.4 | 5.2 | 215 |
| Butyl Benzyl Ether | 17.2 | 3.3 | 3.6 | 215 |
| Bis(2-Furyl) Methane | 18.3 | 5.8 | 5.8 | 215 |
| 1,2-Diisopropylbenzene | 16.9 | 1.3 | 1.1 | 216 |
| p-Diisopropylbenzene | 17 | 1.7 | 1.5 | 216 |
| 1,3-Dimethyladamantane | 16.6 | 0 | 0 | 216 |
| Cyclohexyl Butyrate | 16.7 | 3.2 | 4.3 | 216 |
| Phenethyl Acetal | 17.4 | 4.6 | 4.6 | 216 |
| Dihydroanethol | 17.8 | 4.2 | 4 | 217 |
| 1,2,3-Triethylbenzene | 17.2 | 2.3 | 2.2 | 220 |
| 2-Methyl-[1,2,3,4-Tetrahydronaphthalene] | 18.5 | 2.6 | 2.8 | 222 |
| 1,2,3,4-Tetrahydro-6-Methylnaphthalene | 18.4 | 2.2 | 2.9 | 223 |
| Methyl Benzyl Acetate (Mixed Ortho-, Meta-, Para-) | 17.7 | 3.8 | 5.2 | 223 |
| Hexylbenzene | 17.1 | 1.9 | 2.7 | 224 |
| 1-Phenyl-1-Butanone | 18 | 5.6 | 3.4 | 226 |
| Benzyl Propionate | 17.7 | 4.2 | 5.5 | 226 |
| Propyl Benzoate | 17.6 | 5.6 | 3.6 | 227 |
| α-Isopropyl Phenyl Acetaldehyde | 17.3 | 5 | 3.7 | 227 |
| Ortho-Methyl Benzyl Acetate | 18 | 3.9 | 5.2 | 227 |
| Pentyl Phenyl Ether | 17.4 | 3.5 | 4 | 227 |
| 2-Pentyl Cyclopentanone | 17.1 | 5.8 | 3.1 | 228 |
| 2-Isopropyl Decalin | 16.6 | 0 | 0 | 229 |
| 2-Heptyl Furan | 16.6 | 3.4 | 3.5 | 231 |
| Methyl 2,4-Decadienoate | 16.8 | 3.2 | 5 | 231 |
| Phenethyl Acetate | 17.7 | 4.2 | 5.6 | 232 |
| Methyl Hydrocinnamate | 17.7 | 4.2 | 5.7 | 232 |
| Ethyl 2-Cyclohexyl Propionate | 16.6 | 2.8 | 4 | 232 |
| Phenethyl Butyl Ether | 17 | 3.1 | 3.4 | 232 |
| 2-Methylnaphthalene | 19.3 | 2.9 | 4.2 | 233 |
| Benzylacetone | 17.9 | 5.4 | 4.4 | 234 |
| Phenyl Acetaldehyde Diethyl Acetal | 16.9 | 3.8 | 3.8 | 234 |
| 1-Tert-Butoxy-3,5-Dimethylbenzene | 17.1 | 2.8 | 2.7 | 234 |
| Benzyl Isobutyrate | 17.4 | 3.6 | 4.6 | 235 |
| p-Butoxytoluene | 17.7 | 3.8 | 3.9 | 235 |
| Isobutyl Benzoate | 17.4 | 5 | 3.2 | 236 |
| Cyclododecene | 17.1 | 1.2 | 2.9 | 236 |
| Bicyclohexyl | 17 | 0 | 0 | 239 |
| Benzyl Butyrate | 17.5 | 3.7 | 4.9 | 239 |
| Cyclohexyl Benzene | 18.7 | 0 | 1 | 240 |
| 1,5,9-Cyclododecatriene | 17.7 | 2.5 | 4.6 | 240 |
| Heptylbenzene | 17 | 2 | 2.5 | 241 |
| (E)-3,7-Dimethyl-2,6-Octadien-1-Yl Acetate | 16.7 | 2.4 | 4.5 | 243 |
| Ethyl Hydrocinnamate | 17.5 | 3.9 | 5.1 | 244 |
| Phenethyl Propionate | 17.5 | 3.9 | 5.1 | 244 |
| 1-Methyl Naphthalene | 19.7 | 0.8 | 4.7 | 245 |
| 3-Phenyl Propyl Acetate | 17.5 | 4 | 5.2 | 247 |
| Isobutyl Phenyl Acetate | 17.2 | 3.2 | 4.5 | 247 |
| Benzyl Iso Valerate | 17.2 | 3.2 | 4.5 | 247 |
| Methylpropyl Phenyl Acetate | 17.2 | 3.2 | 4.5 | 247 |
| Butyl Benzoate | 18.3 | 5.6 | 5.5 | 250 |
| Bicyclosesquiphellandrene | 16.7 | 0.5 | 2.1 | 250 |
| Isopentyl Benzoate | 17.3 | 4.9 | 3.2 | 252 |
| 4-Methyl-4-Phenyl Pentanone | 17.3 | 3.8 | 2.9 | 252 |
| 1-Ethylnaphthalene | 19 | 2.8 | 3.8 | 253 |
| 2-Ethylnaphthalene | 19 | 2.7 | 3.8 | 253 |
| Phenyl Ethyl Isobutyrate | 17.2 | 3.3 | 4.3 | 253 |
| 3-Phenyl-4-Pentenal | 17.7 | 5.5 | 4.6 | 253 |
| 2-Phenyl-4-Pentenal | 17.7 | 5.5 | 4.6 | 253 |
| Butyl Phenyl Acetate | 17.4 | 3.6 | 4.8 | 254 |
| 2-Octyl Furan | 16.6 | 2.9 | 3.2 | 254 |
| Benzyl Valerate | 17.4 | 3.6 | 4.8 | 254 |
| 2-Methyl Butyl Benzoate | 17.2 | 4.6 | 2.9 | 254 |
| Phenethyl Butyrate | 17.3 | 3.4 | 4.6 | 256 |
| 2-Hexyl-4-Acetoxytetrahydrofuran | 16.6 | 4.2 | 4.7 | 257 |
| Propyl 2,4-Decadienoate | 16.7 | 2.7 | 4.2 | 257 |
| 1,1,3,3,5-Pentamethylindan (Liquid) | 17.2 | 1.1 | 0.7 | 257 |
| 3-Phenyl Propyl Propionate | 17.3 | 3.8 | 4.8 | 259 |
| Benzyl Crotonate | 18.1 | 3.8 | 5.7 | 259 |
| Amyl Benzoate | 17.4 | 5.2 | 3.5 | 260 |
| 2-Heptyl Cyclopentanone | 16.9 | 5.3 | 2.7 | 261 |
| Isoamyl Phenyl Acetate | 17.1 | 3.1 | 4.3 | 261 |
| Isoamyl Phenyl Acetate | 17.1 | 3.1 | 4.3 | 261 |
| Octylbenzene | 16.9 | 1.6 | 2.2 | 264 |
| Dicyclohexylmethane | 17 | 0 | 0 | 264 |
| Isopropyl Cinnamate | 17.7 | 3.2 | 4.5 | 265 |
| 1,1-Dicyclohexylethane | 16.9 | 0 | 0 | 265 |
| 2-Phenyl Propyl Butyrate | 17.2 | 2.8 | 4.1 | 265 |
| 1-Isopropylnaphthalene | 18.7 | 2.2 | 3.1 | 267 |
| 1-Butyl-[1,2,3,4-Tetrahydronaphthalene] | 17.7 | 1.7 | 1.9 | 267 |
| 2-Isopropylnaphthalene | 18.7 | 2.1 | 3 | 267 |
| 2-Phenyl Propyl Tetrahydrofuran | 17.6 | 3.2 | 3.5 | 267 |
| Isopropylnaphthalene | 18.7 | 2.2 | 3.1 | 267 |
| 3-Methylbiphenyl | 19.2 | 2.1 | 2.5 | 268 |
| 3-Phenyl Propyl Isobutyrate | 17.1 | 3.2 | 4 | 268 |
| Propyl Cinnamate | 17.8 | 3.4 | 4.8 | 268 |
| 2-Ethylbiphenyl | 18.8 | 1.9 | 2.5 | 270 |
| Galbanum Ketone | 16.9 | 3.7 | 3.6 | 270 |
| 2-Phenethyl Valerate | 17.3 | 3.3 | 4.5 | 271 |
| Dimethyl Benzyl Carbinyl Isobutyrate | 16.8 | 2.3 | 2.9 | 271 |
| Dimethyl Benzyl Carbinyl Butyrate | 16.9 | 2.5 | 3.2 | 272 |
| 2-Propylnaphthalene | 18.8 | 2.3 | 3.3 | 273 |
| 2-Methyldiphenylmethane | 18.9 | 1.8 | 2.7 | 273 |
| 3-Phenoxy toluene | 19.3 | 3.5 | 3.7 | 273 |
| 1,1-Diphenylethane | 18.7 | 1.6 | 2.7 | 276 |
| Hexyl Benzoate | 17.2 | 5 | 3.4 | 276 |
| Nonylbenzene | 16.9 | 1.6 | 2.2 | 279 |
| 3-Ethylbiphenyl | 18.9 | 2 | 2.3 | 279 |
| Allyl Cinnamate | 18 | 3.7 | 5.3 | 279 |
| Para-Cresyl Hexanoate | 17.7 | 3.6 | 4.6 | 281 |
| Butyl Cinnamate | 17.7 | 3.3 | 4.7 | 283 |
| Benzyl Heptanoate | 17.2 | 3.2 | 4.4 | 284 |
| 3-Methyldiphenylmethane | 19 | 1.9 | 2.5 | 286 |
| 1-sec-Butylnaphthalene | 18.6 | 1.7 | 2.7 | 286 |
| Cyclopentadecane | 16.9 | 0 | 0 | 287 |
| Dibenzyl Ether | 19.6 | 3.4 | 5.2 | 288 |
| Isoamyl Cinnamate | 17.4 | 2.8 | 4.2 | 289 |
| 3-Phenyl Propyl Isovalerate | 16.9 | 3 | 3.9 | 290 |
| Heptyl Benzoate | 17.1 | 4.9 | 3.1 | 291 |
| 3,3'-Dimethylbiphenyl | 19.3 | 2 | 1.8 | 293 |
| (Z)-3-Hexen-1-Yl Benzoate | 17.6 | 5 | 3.7 | 293 |
| 1,3-Diphenylpropane | 18.3 | 2.1 | 2.9 | 294 |
| 5,5-Dibutyl Dihydrofuran-2(3H)-One | 16.5 | 5.8 | 3.6 | 297 |
| Phenethyl Heptanoate | 17 | 3.1 | 4.2 | 298 |
| 3-Phenyl Propyl Hexanoate | 17 | 3.1 | 4.2 | 298 |

Hd refers to Dispersion contribution
Hp refers to Polar contribution
Hh refers to Hydrogen bonding contribution Preferably, at least one of the solvents can comprise a relative evaporation rate (Butyl acetate=100) of at least 0.01, particularly of at least 0.1, especially of at least 0.5, preferably of at least 1, and most preferably of at least 2. The relative evaporation rate can be determined according to DIN 53170:2009-08. For the purpose for making a rough estimate, the relative evaporation rate can be calculated using the Hansen Solubility Parameters with the HSPiP program as mentioned above and below.

According to a preferred embodiment of the present invention, the relative evaporation rate of the first organic solvent (S-1) is at least 0.05, preferably at least 0.1. Preferably, the relative evaporation rate of the first organic solvent (S-1) is at most 10, preferably at most 5.

Moreover, the relative evaporation rate of the second organic solvent (S-2) preferably is at most 1, especially preferably at most 0.5, more preferably at most 0.9, and most preferably at most 0.04.

The composition of the present invention can particularly comprise at least 70% by weight, especially at least 80% by weight and preferably at least 90% by weight of organic solvents.

Preferably, the present formulation comprises at least 5% by weight, more preferably at least 10% by weight and most preferably at least 15% by weight of the first organic solvent (S-1). In a preferred embodiment the present formulation comprises 5 to 94, preferably 10 to 87.5 and more preferably 15 to 82% by weight of the first organic solvent (S-1).

In a further preferred embodiment the present formulation comprises at least 5% by weight, more preferably at least 10% by weight and most preferably at least 15% by weight of the second organic solvent (S-2). Preferably, the present formulation comprises 5 to 94, preferably 10 to 87.5 and more preferably 15 to 82% by weight of the second organic solvent (S-2).

In a further aspect of the present invention, the weight ratio of said first organic solvent (S-1) to said second organic solvent (S-2) is preferably higher than 0.5, especially preferably higher than 1 and more preferably higher than 2.

In a preferred embodiment the present formulation may comprise further additive to reduce the surface tension, or to improve the film formation. The suitable additive can be preferably referred to, e.g., WO 2003/019693 A2

The formulation according to the present invention can additionally comprise one or more further components like for example surface-active compounds, lubricating agents, wetting agents, binding agents, dispersing agents, hydrophobing agents, adhesive agents, flow improvers, defoaming agents, deaerators, diluents which may be reactive or non-reactive, auxiliaries, colourants, dyes or pigments, sensitizers, stabilizers, or inhibitors.

Preferably, a polymeric binder and/or a wetting agent can be used as additive.

The term organic semiconducting compound preferably refers to hole injection materials (HIM), hole transport materials (HTM), hole blocking materials (HBM), electron injection materials (EIM), electron transport materials (ETM), electron blocking materials (EBM), exciton blocking materials (ExBM), host materials, emitter materials, preferably phosphorescent emitter materials. The term organic semiconducting compound also includes organometallic complexes of transition metals, rare earths, lanthanides and actinides.

The organic semiconducting compound may be selected from the group of small molecules, polymers, oligomers, or dendrimers, blends or mixtures thereof.

The term small molecule as used herein is defined as molecule not being a polymer, oligomer, dendrimer, or a blend. In particular, repeating structures are absent in small molecules. The molecular weight of small molecules is typically in the range of polymers with a low number of repeating units, oligomers or less.

The molecular weight of the small molecule is preferably below 5000 g/mol, more preferably below 4000 g/mol, particularly preferably below 3000 g/mol, especially preferably below 2000 g/mol, and very particularly preferably below 1000 g/mol.

Preferably, at least one of the organic semiconducting compounds has a molecular weight of at most 5,000 g/mol.

In another preferred embodiment any of the organic semiconducting materials as used herein is a small molecule.

The term small molecule organic semiconducting material as used herein is defined as organic semiconducting material fulfilling the criteria for a small molecule.

The polymers being useful as organic semiconducting of the present invention compounds preferably have 10 to 10000, particularly preferably 20 to 5000 and very particularly preferably 50 to 2000 repeat units. Oligomers according to this invention have preferably 2 to 9 repeat units. The branching index of the polymers and oligomers is between 0 (linear polymer without branching) and 1 (completely branched dendrimer). The term dendrimer as used herein is defined according to M. Fischer et al. in Angew. Chem., Int. Ed. 1999, 38, 885).

Preferably, at least one of the organic semiconducting compounds has a molecular weight (Mw) of at least 10,000 g/mol, more preferably at least 20,000 g/mol.

The molecular weight (Mw) of the polymers of the present invention useful as organic semiconducting compounds is preferably in the range of 10000 to 2000000 g/mol, particularly preferably in the range of 50000 to 500000 g/mol, and very particularly preferably in the range of 75000 to 200000 g/mol. The determination of Mw can be performed according to standard techniques known to the person skilled in the art by employing gel permeation chromatography (GPC) with polystyrene as internal standard, for instance. The molecular weight (Mw) refers to the weight average.

A blend is a mixture comprising at least one polymeric dendrimeric, or oligomeric component.

Within the meaning of the present invention a material or compound is insoluble in a solvent if its solubility at 25° C. is less than 0.5 g/100 ml, preferably less than 0.1 g/100 ml, particularly preferably less than 0.001 g/100 ml.

A formulation of the present invention may comprise at least one small molecule organic semiconducting material preferably having a molecular weight of 5000 g/mol or less, preferably 4000 g/mol or less, more preferably 3000 g/mol or less, and particularly preferably 2000 g/mol or less.

Preferably, the formulation of the present invention may comprise at least one polymeric organic semiconducting material preferably having a molecular weight $M_w$ of 10000 g/mol or more, preferably at least 20000 g/mol.

Preferred first organic semiconducting compounds (OSC-1) can comprise Hansen Solubility parameters of $H_d$ in the range of 15.0 to 23.2 MPa$^{0.5}$, $H_p$ in the range of 0.2 to 12.5 MPa$^{0.5}$ and $H_h$ in the range of 0.0 to 20.0 MPa$^{0.5}$. More preferred organic solvents comprise Hansen Solubility parameters of $H_d$ in the range of 15.0 to 23.2 MPa$^{0.5}$, $H_p$ in the range of 0.2 to 10.5 MPa$^{0.5}$ and $H_h$ in the range of 0.0 to 5.0 MPa$^{0.5}$.

Preferred second organic semiconducting compounds (OSC-2) can comprise Hansen Solubility parameters of $H_d$ in the range of 16.0 to 23.2 MPa$^{0.5}$, H$_p$ in the range of 0.2 to 12.5 MPa$^{0.5}$ and H$_h$ in the range of 0.0 to 20.0 MPa$^{0.5}$. More preferred organic solvents comprise Hansen Solubility parameters of H$_d$ in the range of 16.0 to 23.2 MPa$^{0.5}$, H$_p$ in the range of 0.2 to 10.5 MPa$^{0.5}$ and H$_h$ in the range of 0.0 to 5.0 MPa$^{0.5}$.

In a preferred embodiment the formulation comprises at least 1.0, preferably 2.5, more preferably at least 3 and most preferably at least 4.0% by weight of the organic semiconducting compounds including the first organic semiconducting compound (OSC-1) and the second organic semiconducting compound (OSC-2). Preferably, the formulation comprises 0.5 to 10%, preferably 0.7 to 8%, more preferably at least 1.0 to 7% and most preferably at least 1.5 to 6% % by weight of the organic semiconducting compounds, including the first organic semiconducting compound (OSC-1) and the second organic semiconducting compound (OSC-2). If additional organic semiconducting compounds are present as mentioned below concerning a third organic semiconducting compound (OSC-3) and a fourth organic semiconducting compound (OSC-4), the values mentioned above also include the amounts of these additional organic semiconducting compounds.

Preferably the said small molecule organic semiconducting materials are selected from hole injection materials (HIM), hole transport materials (HTM), hole blocking materials (HBM), electron injection materials (EIM), electron transport materials (ETM), electron blocking materials (EBM), exciton blocking materials (ExBM), host materials, emitter materials, and metal complexes.

Preferably, the said polymeric semiconducting materials are selected from hole injection materials (HIM), hole transport materials (HTM), hole blocking materials (HBM), electron injection materials (EIM), electron transport materials (ETM), electron blocking materials (EBM), exciton blocking materials (ExBM), host materials, emitters, metal complexes.

The emitter materials are preferably selected from the class of organic electroluminescent emitter materials as outlined elsewhere within the present invention.

Organic semiconducting materials, especially small molecule semiconducting materials and/or polymeric semiconducting materials according to this invention are often characterized by their molecular frontier orbitals, i.e. the highest occupied molecular orbital (HOMO) (sometimes also referred to as valence band) and the lowest unoccupied molecular orbital (LUMO)(sometimes also referred to as conduction band). The HOMO and LUMO levels are routinely measured (by e.g. XPS=X-ray photoelectron spectroscopy, UPS=ultra-violet photoelectron spectroscopy or CV=cyclovoltammetry) or calculated (by quantum chemical methods such as (time dependent) DFT=density functional theory) which are known to the person skilled in the art. One skilled in the art is also aware of the fact that absolute values of these energy levels significantly depend on the method used. The applicants established a consistent combination method to determine the energy levels of organic semiconductors. The HOMO/LUMO levels of a set of semiconductors (more than 20 different semiconductors) are measured by CV with a reliable evaluation method and also calculated by the DFT of Gaussian 03W with the same correction functional, for example B3PW91 and the same basis set, for example 6-31 G(d). The calculated values are then calibrated according to the measured values. Such calibration factor is used for further calculation. The agreement between calculated and measured values is very good. Therefore, the comparison of the energy levels of this invention is set on a sound base. The energy gaps or band gaps are obtained by the difference between HOMO and LUMO energy levels.

Preferably, the HOMO and LUMO positions and the triplet level of the materials are determined via quantum-chemical calculations. To this end, the "Gaussian-03W" software package (Gaussian Inc.) is used. In order to calculate organic substances without metals, firstly a geometry optimisation is carried out using the "Ground State/Semi-empirical/Default Spin/AM1/Charge 0/Spin Singlet" method. This is followed by an energy calculation on the basis of the optimised geometry. The "TD-SFC/DFT/Default Spin/B3PW91" method with the "6-31G(d)" base set is used here (Charge 0, Spin Singlet). For organometallic compounds, the geometry is preferably optimised via the "Ground State/Hartree-Fock/Default Spin/LanL2MB/Charge 0/Spin Singlet" method. The energy calculation is carried out analogously to the organic substances as described above, with the difference that the "LanL2DZ" base set is used for the metal atom and the "6-31G(d)" base set is used for the ligands. The energy calculation gives the HOMO HEh or LUMO LEh in hartree units. The HOMO and LUMO values calibrated with reference to cyclic voltammetry measurements are determined therefrom in electron volts as follows:

HOMO(eV)=((HEh*27.212)−0.9899)/1.1206
LUMO(eV)=((LEh*27.212)−2.0041)/1.385

For the purposes of this application, these values are to be regarded as HOMO and LUMO respectively of the materials. The triplet level T1 is defined as the energy of the triplet state having the lowest energy, which arises from the quantum-chemical calculation.

The formulations according to the invention may comprise one or more organic semiconducting materials, especially small molecule semiconducting materials and/or polymeric semiconducting materials selected from hole injection materials (HIM). A HIM refers to a material or unit capable of facilitating holes (i.e. positive charges) injected from an anode into an organic layer or an anode. Typically, a HIM has a HOMO level comparable to or higher than the work function of the anode, i.e. −5.3 eV or higher.

The formulations according to the invention may comprise one or more organic semiconducting materials, especially small molecule semiconducting materials and/or polymeric semiconducting materials selected from hole transport materials (HTM). The organic semiconducting material of the composition of the present invention can also be a hole transport material (HTM). A HTM is characterized in that it is a material or unit capable of transporting holes (i.e. positive charges) injected from a hole injecting material or an anode. A HTM has usually high HOMO, typically higher than −5.4 eV. In many cases, HIM can functions also as HTM, depending on the adjacent layer.

The formulations according to the invention may comprise one or more organic semiconducting materials, especially small molecule semiconducting materials and/or polymeric semiconducting materials selected from hole blocking materials (HBM). A HBM refers to a material which, if deposited adjacent to an emissive layer or a hole transporting layer in a multilayer structure, prevents the holes flowing through. Usually it has a lower HOMO as compared to the HOMO level of the HTM in the adjacent layer. Hole-blocking layers are frequently inserted between the light-emitting layer and the electron-transport layer in OLEDs.

The formulations according to the invention may comprise one or more organic semiconducting materials, especially small molecule semiconducting materials and/or polymeric semiconducting materials selected from electron injection materials (EIM). An EIM refers to a material capable of facilitating electrons (i.e. negative charges) injected from cathode into an organic layer. The EIM usually has a LUMO level comparable to or lower than the working function of cathode. Typically, the EIM has a LUMO lower than −2.6 eV.

The formulations according to the invention may comprise one or more organic semiconducting materials, especially small molecule semiconducting materials and/or polymeric semiconducting materials selected from electron transport materials (ETM). An ETM refers to a material capable of transporting electrons (i.e. negative charges) injected from an EIM or a cathode. The ETM has usually a low LUMO, typically lower than −2.7 eV. In many cases, an EIM can serve as ETM as well, depending on the adjacent layer.

The formulations according to the invention may comprise one or more organic semiconducting materials, especially small molecule semiconducting materials and/or polymeric semiconducting materials selected from electron blocking materials (EBM). An EBM refers to a material which, if deposited adjacent to an emissive or electron transporting layer in a multilayer structure, prevents the electron flowing through. Usually it has a higher LUMO as compared to the LUMO of the ETM in the adjacent layer.

The formulations according to the invention may comprise one or more organic semiconducting materials, especially small molecule semiconducting materials and/or polymeric semiconducting materials selected from exciton blocking materials (ExBM). An ExBM refers to a material which, if deposited adjacent to an emissive layer in a multilayer structure, prevents the excitons diffuse through. ExBM should have either a higher triplet level or singlet level as compared to the emissive layer or other adjacent layer.

The formulations according to the invention may comprise one or more organic semiconducting materials, especially small molecule semiconducting materials and/or polymeric semiconducting materials selected from emitters. The term emitter refers to a material which, upon receiving excitonic energy by any kind of energy transfers from other materials, or by forming an exciton either electrically or optically, undergoes radiative decay to emit light. There are two classes of emitters, fluorescent and phosphorescent emitters. The term fluorescent emitter relates to materials or compounds which undergo a radiative transition from an excited singlet state to its ground. The term phosphorescent emitter, as used herein, relates to luminescent materials or compounds which comprise transition metals. This typically includes materials emitting light caused by spin forbidden transition(s), e.g., transitions from excited triplet states.

The term dopant as employed herein is also used for the term emitter or emitter material.

The formulations according to the invention may comprise one or more organic semiconducting materials, especially small molecule semiconducting materials and/or polymeric semiconducting materials selected from host materials. Host materials are usually used in combination with emitter and have, in general, larger energy gaps between the HOMO and the LUMO as compared to emitter materials. In addition, host materials behave either as electron or hole transport material. Host materials can also have both electron and hole transport properties. In case singlet transitions are predominantly responsible for photoluminescence in OLEDs, a maximal overlap between the absorption spectrum of the emitter with the photoluminescence spectrum of the host material is highly desirably. This ensures the energy transfer from the host material to the emitter.

Host material is also called matrix or matrix material, particularly if a host is meant which is used in combination with a phosphorescent emitter in an OLEDs. And for copolymer, comprising emitter unit, the polymer backbone has the same mean as host.

The formulations according to the invention may comprise one or more organic semiconducting materials, especially small molecule semiconducting materials and/or polymeric semiconducting materials selected from metal complexes. According to quantum mechanics the transition from excited states with high spin multiplicity, e.g. from excited triplet states, to ground state is forbidden.

However, in the existence of an heavy atom, for example iridium, osmium, platinum and europium, results in a strong spin-orbit coupling, i.e. the excited singlet and triplet are mixed so that triplet gains some singlet character; and if singlet -triplet mixing yields a radiative decay rate faster than the non-radiative event, then the luminance can be efficient. This kind of emission can be achieved using metal complex, as firstly reported by Baldo et al.; Nature 395, 151-154 (1998). Further metal complexes can also function as efficient and broad-band light absorbing materials or dyes, as for example Ru complex reported by B. O'Regan & M. Graetzel, Nature 353, 737 (1991).

Further to HIMs mentioned elsewhere herein, suitable HIMs are phenylenediamine derivatives (U.S. Pat. No. 3,615,404), arylamine derivatives (U.S. Pat. No. 3,567,450), amino-substituted chalcone derivatives (U.S. Pat. No. 3,526, 501), styrylanthracene derivatives (JP Showa 54 (1979) 110837), hydrazone derivatives (U.S. Pat. No. 3,717,462), acylhydrazones, stilbene derivatives (JP Showa 61 (1986) 210363), silazane derivatives (U.S. Pat. No. 4,950,950), polysilane compounds (JP Heisei 2 (1990) 204996), PVK and other electrically conductive macromolecules, aniline-based copolymers (JP Heisei 2 (1990) 282263), electrically conductive, macromolecular thiophene oligomers (JP Heisei 1 (1989) 211399), PEDOT:PSS (spin-coated polymer), plasma-deposited fluorocarbon polymers (U.S. Pat. Nos. 6,127,004, 6,208,075, 6,208,077), porphyrin compounds (JP Showa 63 (1988) 2956965, U.S. Pat. No. 4,720,432), aromatic tertiary amines and styrylamines (U.S. Pat. No. 4,127, 412), triphenylamines of the benzidine type, triphenylamines of the styrylamine type, and triphenylamines of the diamine type. Arylamine dendrimers can also be used (JP Heisei 8 (1996) 193191), as can phthalocyanine derivatives, naphthalocyanine derivatives, or butadiene derivatives, are also suitable.

Preferably, the HIM is selected from monomeric organic compound comprising amine, triarylamine, thiophene, carbazole, phthalocyanine, porphyrine and their derivatives.

Particular preference is given to the tertiary aromatic amines (US 2008/0102311 A1), for example N,N'-diphenyl-N,N'-di(3-tolyl)benzidine (=4,4'-bis[N-3-methylphenyl]-N-phenylamino)biphenyl (NPD) (U.S. Pat. No. 5,061,569), N,N'-bis(N,N'-diphenyl-4-aminophenyl)-N,N-diphenyl-4, 4'-diamino-1,1'-biphenyl (TPD 232) and 4,4',4"-tris[3-methylphenyl)-phenylamino]-triphenylamine (MTDATA) (JP Heisei 4 (1992) 308688) or phthalocyanine derivatives (for example H2Pc, CuPc, CoPc, NiPc, ZnPc, PdPc, FePc, MnPc, ClAlPc, ClGaPc, ClInPc, ClSnPc, Cl2SiPc, (HO) AlPc, (HO)GaPc, VOPc, TiOPc, MoOPc, GaPc-O-GaPc).

Particular preference is given to the following triarylamine compounds of the Formulae TA-1 (TPD 232), TA-2, TA-3, and TA-4, which may also be substituted, and further compounds as disclosed in U.S. Pat. No. 7,399,537 B2, US 2006/0061265 A1, EP 1661888 B1, and JP 08292586 A.

Further compounds suitable as hole injection material are disclosed in EP 0891121 A1 and EP 1029909 A1. Hole injection layers in general are described in US 2004/0174116.
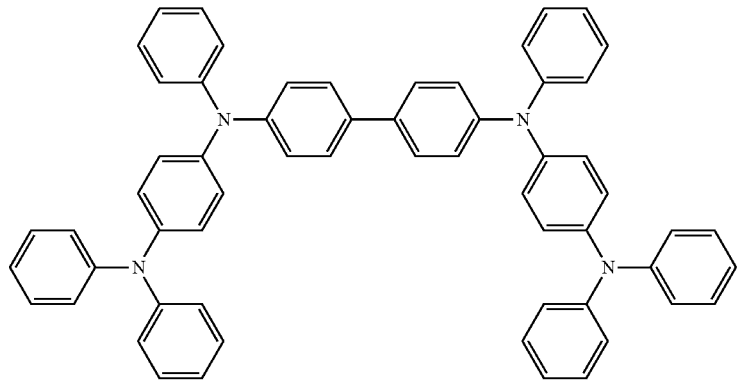
Formula TA-1
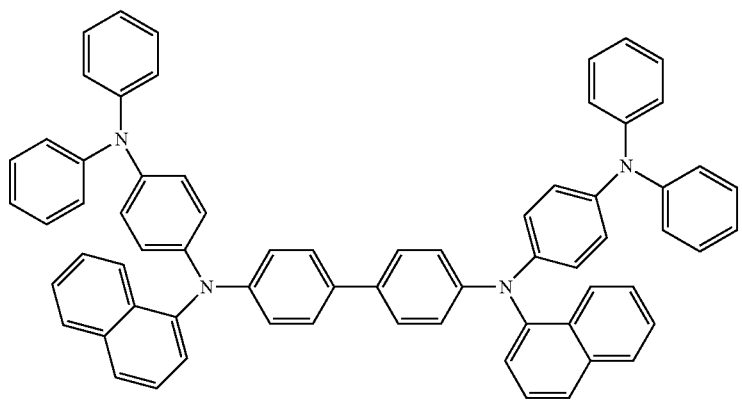
Formula TA-2
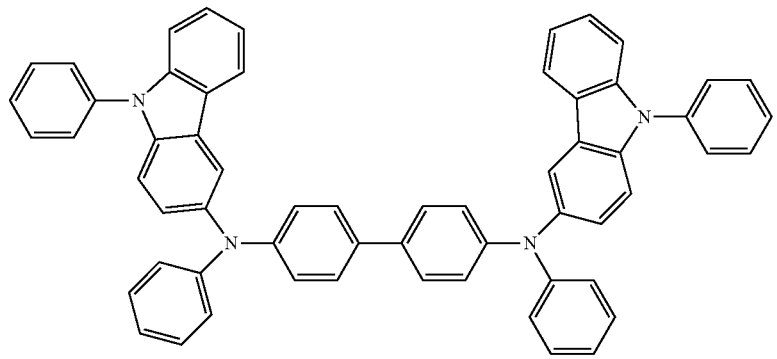
Formula TA-3

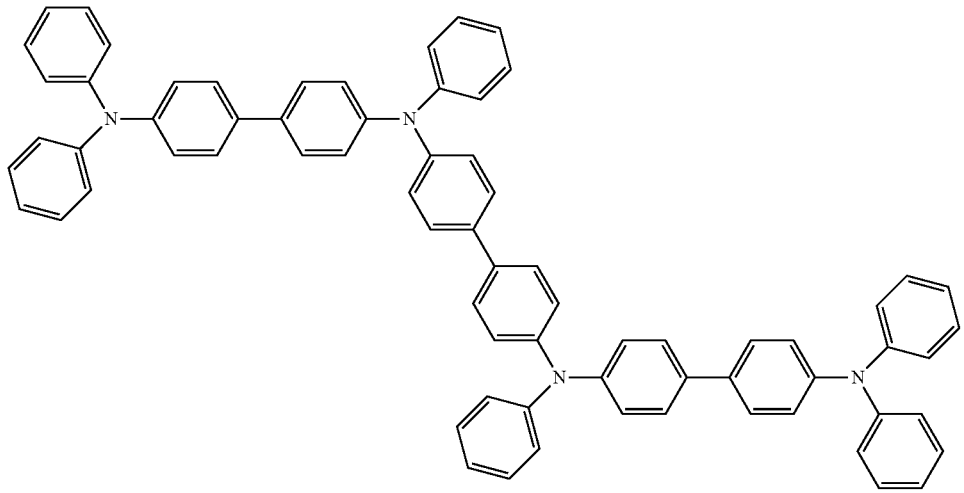

Formula TA-4

In principle any HTM known to one skilled in the art can be employed in formulations according to the present invention. Further to HTM mentioned elsewhere herein, HTM is preferably selected from amines, triarylamines, thiophenes, carbazoles, phthalocyanines, porphyrines, isomers and derivatives thereof. HTM is particularly preferably selected from amines, triarylamines, thiophenes, carbazoles, phthalocyanines, and porphyrines.

Suitable materials for hole-transporting layers are phenylenediamine derivatives (U.S. Pat. No. 3,615,404), arylamine derivatives (U.S. Pat. No. 3,567,450), amino-substituted chalcone derivatives (U.S. Pat. No. 3,526,501), styrylanthracene derivatives (JP A 56-46234), polycyclic aromatic compounds (EP 1009041), polyarylalkane derivatives (U.S. Pat. No. 3,615,402), fluorenone derivatives (JP A 54-110837), hydrazone derivatives (U.S. Pat. No. 3,717,462), stilbene derivatives (JP A 61-210363), silazane derivatives (U.S. Pat. No. 4,950,950), polysilanes (JP A 2-204996), aniline copolymers (JP A 2-282263), thiophene oligomers, polythiophenes, PVK, polypyrroles, polyanilines and further copolymers, porphyrin compounds (JP A 63-2956965), aromatic dimethylidene-type compounds, carbazole compounds, such as, for example, CDBP, CBP, mCP, aromatic tertiary amine and styrylamine compounds (U.S. Pat. No. 4,127,412), and monomeric triarylamines (U.S. Pat. No. 3,180,730). Even more triarylamino groups may also be present in the molecule.

Preference is given to aromatic tertiary amines containing at least two tertiary amine units (U.S. Pat. Nos. 4,720,432 and 5,061,569), such as, for example, 4,4'-bis[N-(1-naphthyl)-N-phenylamino]biphenyl (NPD) (U.S. Pat. No. 5,061,569) or MTDATA (JP A 4-308688), N,N,N',N'-tetra(4-biphenyl)diaminobiphenylene (TBDB), 1,1-bis(4-di-p-tolylaminophenyl)cyclohexane (TAPC), 1,1-bis(4-di-p-tolylaminophenyl)-3-phenylpropane (TAPPP), 1,4-bis[2-[4-[N,N-di(p-tolyl)amino]phenyl]vinyl]benzene (BDTAPVB), N,N,N', N'-tetra-p-tolyl-4,4'-diaminobiphenyl (TTB), TPD, N,N,N',N'-tetraphenyl-4,4''-diamino-1,1':4',1'':4'',1'''-quaterphenyl, likewise tertiary amines containing carbazole units, such as, for example, 4 (9H-carbazol-9-yl)-N,N-bis[4-(9H-carbazol-9-yl)phenyl]benzeneamine (TCTA). Preference is likewise given to hexaazatriphenylene compounds in accordance with US 2007/0092755 A1.

Particular preference is given to the following triarylamine compounds of the Formulae TA-5 to TA-10, which may also be substituted, and as disclosed in EP 1162193 B1, EP 650955 B1, Synth. Metals 1997, 91(1-3), 209, DE 19646119 A1, WO 2006/122630 A1, EP 1860097 A1, EP 1834945 A1, JP 08053397 A, U.S. Pat. No. 6,251,531 B1, and WO 2009/041635.

Formula TA-5

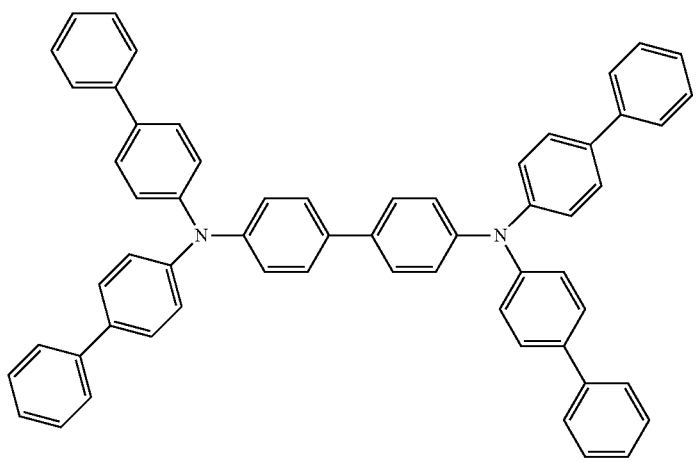

-continued

Formula TA-6

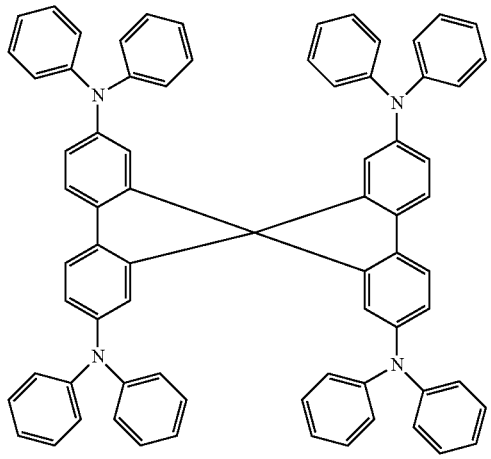

Formula TA-7

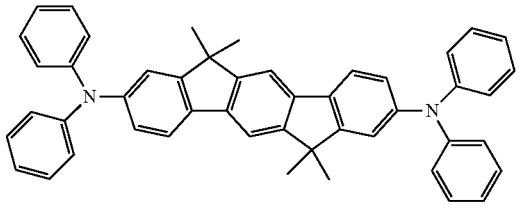

Formula TA-8

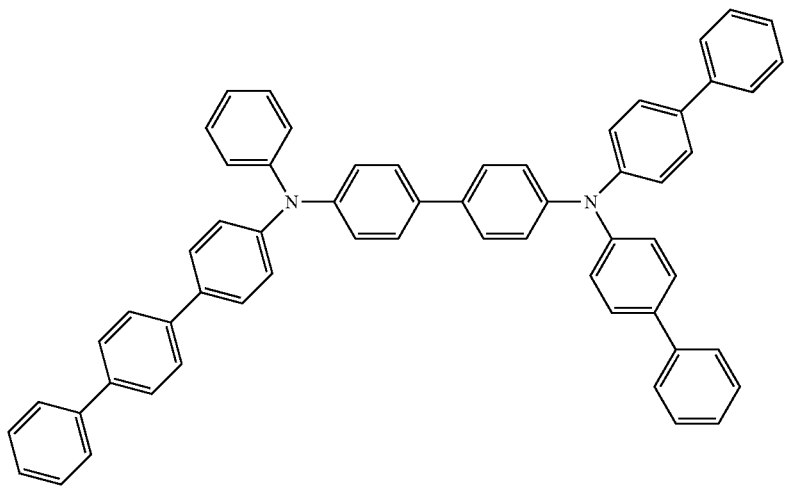

Formula TA-9

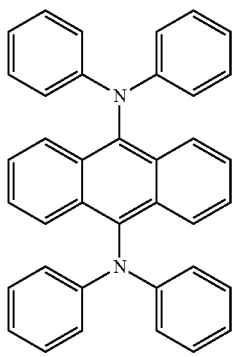

Formula TA-10

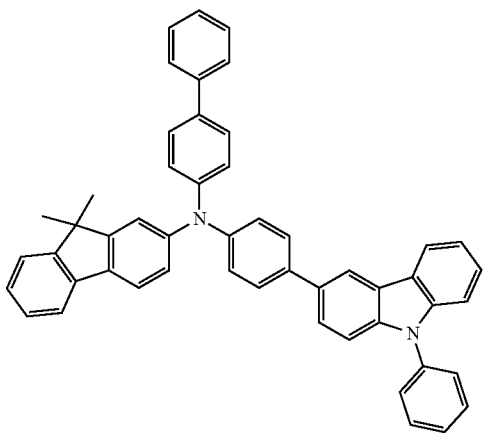

In principle any HBM known to one skilled in the art can be employed in formulations according to the present invention. Further to HBM mentioned elsewhere herein, suitable hole-blocking materials are metal complexes (US 2003/0068528), such as, for example, bis(2-methyl-8-quinolinolato)(4-phenylphenolato)-aluminium(III) (BAlQ). Fac-tris(1-phenylpyrazolato-N,C2)iridium(III) (Ir(ppz)$_3$) is likewise used for this purpose (US 2003/0175553 A1). Phenanthroline derivatives, such as, for example, BCP, or phthalimides, such as, for example, TMPP, are likewise employed.

Further, suitable hole-blocking materials are described in WO 00/70655 A2, WO 01/41512 and WO 01/93642 A1.

In principle any EIM known to one skilled in the art can be employed in formulations according to the present invention. Further to EIM mentioned elsewhere herein, suitable EIM elsewhere herein, EIMs, which comprises at least one organic compound selected from metal complexes of 8-hydroxyquinoline, heterocyclic organic compounds, fluorenones, fluorenylidene methane, perylenetetracarboxylic acid, anthraquinone dimethanes, diphenoquinones, anthrones, anthraquinonediethylene-diamines, isomers and derivates thereof can be used according to the invention.

Metal complexes of 8 hydroxyquinoline, such as, for example, $Alq_3$ and $Gaq_3$, can be used as EIM for electron-injection layers. A reducing doping with alkali metals or alkaline-earth metals, such as, for example, Li, Cs, Ca or Mg, at the interface to the cathode is advantageous. Preference is given to combinations which include Cs, for example Cs and Na, Cs and K, Cs and Rb or Cs, Na and K.

Heterocyclic organic compounds, such as, for example, 1,10-phenanthroline derivatives, benzimidazoles, thiopyran dioxides, oxazoles, triazoles, imidazoles or oxadiazoles, are likewise suitable. Examples of suitable five-membered rings containing nitrogen are oxazoles, thiazoles, oxadiazoles, thiadiazoles, triazoles, and compounds which are disclosed in US 2008/0102311 A1.

Preferred EIMs are selected from compounds with the Formulae ET-1 to ET-3, which may be substituted or unsubstituted.

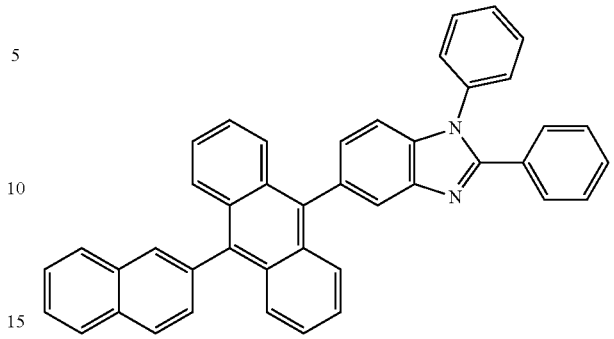

Formula ET-5

In principle any ETM known to one skilled in the art can be employed in formulations according to the present invention. Further to ETM mentioned elsewhere herein, suitable ETM is selected from the group consisting of imidazoles, pyridines, pyrimidines, pyridazines, pyrazines, oxadiazoles, chinolines, chinoxalines, anthracenes, benzanthracenes,

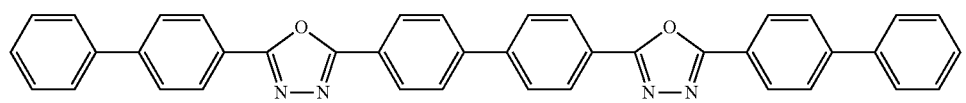

Formula ET-1

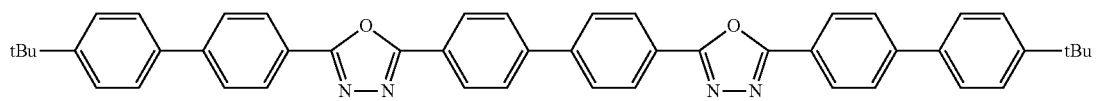

Formula ET-2

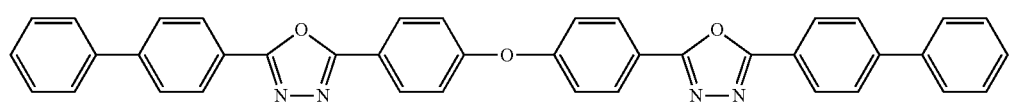

Formula ET-3

Organic compounds, such as fluorenones, fluorenylidene methane, perylenetetracarboxylic acid, anthraquinone dimethanes, diphenoquinones, anthrones and anthraquinonediethylenediamines, can also be employed, for example

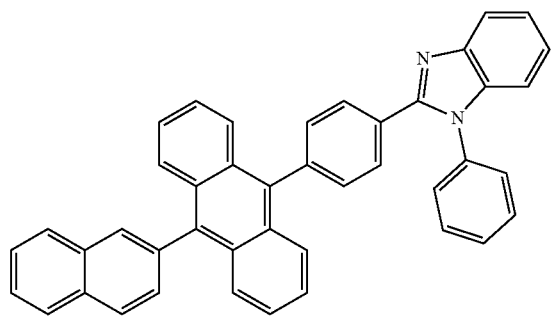

Formula ET-4 pyrenes, perylenes, benzimidazoles, triazines, ketones, phosphinoxides, phenazines, phenanthrolines, triarylboranes, isomers and derivatives thereof.

Suitable ETMs for electron-transporting layers are metal chelates of 8 hydroxyquinoline (for example Liq, $Alq_3$, $Gaq_3$, $Mgq_2$, $Znq_2$, $Inq_2$, $Zrq_4$), Balq, 4 azaphenanthrene-5-ol/Be complexes (U.S. Pat. No. 5,529,853 A; e.g. Formula ET-6), butadiene derivatives (U.S. Pat. No. 4,356,429), heterocyclic optical brighteners (U.S. Pat. No. 4,539,507), benzazoles, such as, for example, 1,3,5-tris(2-N-phenylbenzimidazolyl)benzene (TPBI) (U.S. Pat. No. 5,766,779, Formula ET-7), 1,3,5-trazines, pyrenes, anthracenes, tetracenes, fluorenes, spirobifluorenes, dendrimers, tetracenes, for example rubrene derivatives, 1,10-phenanthroline derivatives (JP 2003/115387, JP 2004/311184, JP 2001/267080, WO 2002/043449), silacyl-cyclopentadiene derivatives (EP 1480280, EP 1478032, EP 1469533), pyridine derivatives (JP 2004/200162 Kodak), phenanthrolines, for example BCP and Bphen, also a number of phenanthrolines bonded via biphenyl or other aromatic groups (US 2007/0252517

A1) or phenanthrolines bonded to anthracene (US 2007/0122656 A1, e.g. Formulae ET-8 and ET-9), 1,3,4-oxadiazoles, for example Formula ET-10, triazoles, for example Formula ET-11, triarylboranes, for example also with Si (e.g. Formula 48), benzimidazole derivatives and other N heterocyclic compounds (cf. US 2007/0273272 A1), silacyclopentadiene derivatives, borane derivatives, Ga oxinoid complexes.

Preference is given to 2,9,10-substituted anthracenes (with 1- or 2-naphthyl and 4- or 3-biphenyl) or molecules which contain two anthracene units (US 2008/0193796 A1).

Formula ET-6

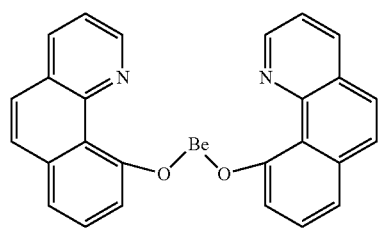

Formula ET-7

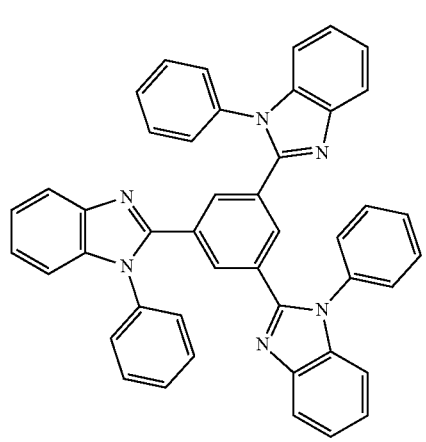

Formula ET-8

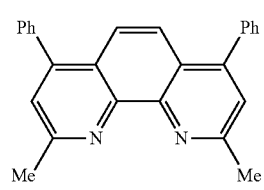

Formula ET-9

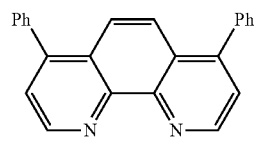

Formula ET-10

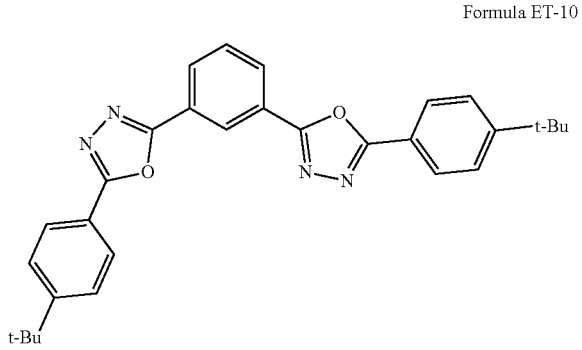

Formula ET-11

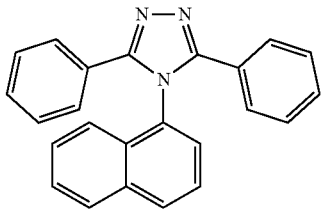

Preference is likewise given to anthracene-benzimidazole derivatives, such as, for example, the compounds of Formulae ET-12 to 14, and as disclosed in, e.g., U.S. Pat. No. 6,878,469 B2, US 2006/147747 A, and EP 1551206 A1.

Formula ET-12

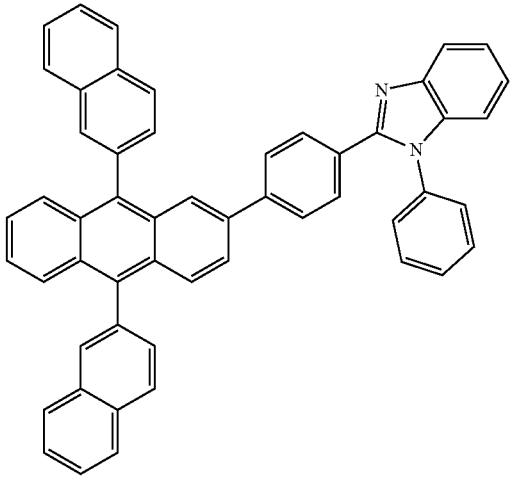

Formula ET-13

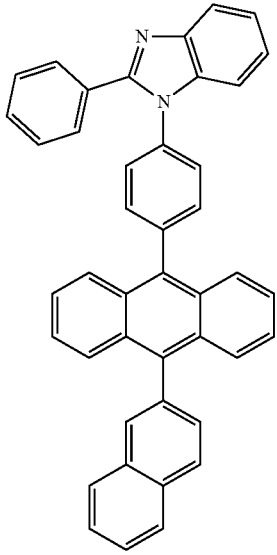

-continued

Formula ET-14

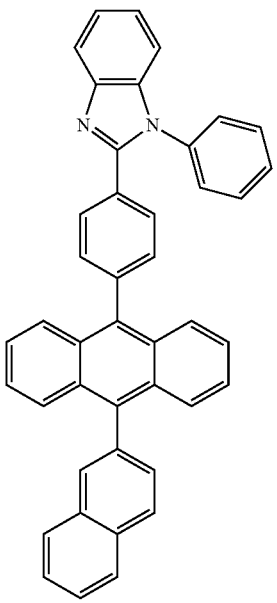

In principle any EBM known to one skilled in the art can be employed in formulations according to the present invention. Further to EBM mentioned elsewhere herein, transition-metal complexes, such as, for example, Ir(ppz)$_3$ (US 2003/0175553) can be employed as materials for an electron-blocking layer.

Preferably, the EBM is further selected from amines, triarylamines and their derivatives.

It is known to a person skilled in the art that the selection of ExBMs suitable for formulations according to the present invention depends on the energy gap of the adjacent layer. Suitable ExBMs are supposed to have a bigger energy gap, either singlet or triplet than the semiconducting material in the adjacent layer which is preferably an emissive layer. Further to ExBMs mentioned elsewhere herein, substituted triarylamines, such as, for example, MTDATA or 4,4',4"-tris(N,N-diphenylamino)triphenylamine (TDATA), can be used as ExBM for electron-blocking layers. Substituted triarylamines are described, for example, in US 2007/0134514 A1.

N-substituted carbazole compounds, such as, for example, TCTA, or heterocycles, such as, for example, BCP, are also suitable.

Metal complexes, such as, for example, Ir(ppz)$_3$ or Alq$_3$, can likewise be used for this purpose.

In principle any host material known to one skilled in the art can be employed in formulations according to the present invention. Depending on the kind of emitter employed host materials can be separated into two categories, hosts for fluorescent emitter and hosts for phosphorescent emitter, whereby the latter is often referred to as matrix or matrix material.

Formulations according to the present invention may also comprise more than one host material, preferably it comprises 3 host materials, particularly preferably it comprises 2 host materials, and very particularly preferably one host material. If aformulation according to this invention comprises at least two host materials, the host materials are also referred to as co-host or co-host materials.

Preferred host materials suitable for fluorescent emitter are selected from anthracenes, benzanthracenes, indenofluorenes, fluorenes, spirobifluorenes, phenanthrenes, dehydrophenanthrenes, thiophenes, triazines, imidazole and derivatives thereof.

Particularly preferred host materials for fluorescent emitter are selected from the classes of the oligoarylenes (for example 2,2',7,7'-tetraphenylspirobifluorene in accordance with EP 676461 or dinaphthylanthracene), in particular the oligoarylenes containing condensed aromatic groups, such as, for example, phenanthrene, tetracene, coronene, chrysene, fluorene, spirofluorene, perylene, phthaloperylene, naphthaloperylene, decacyclene, rubrene, the oligoarylenevinylenes (for example 4,4'-bis(2,2-diphenylethenyl)-1,1'-biphenyl (DPVBi) or 4,4-bis-2,2-diphenylvinyl-1,1-spirobiphenyl (spiro-DPVBi) in accordance with EP 676461), the polypodal metal complexes (for example in accordance with WO 2004/081017), in particular metal complexes of 8 hydroxyquinoline, for example aluminium (III) tris(8-hydroxyquinoline) (aluminium quinolate, Alq$_3$) or bis(2-methyl-8-quinolinolato)-4-(phenylphenolinolato) aluminium, also with imidazole chelate (US 2007/0092753 A1) and quinoline-metal complexes, aminoquinoline-metal complexes, benzoquinoline-metal complexes, the hole-conducting compounds (for example in accordance with WO 2004/058911), the electron-conducting compounds, in particular ketones, phosphine oxides, sulfoxides, etc. (for example in accordance with WO 2005/084081 and WO 2005/084082), the atropisomers (for example in accordance with WO 2006/048268), the boronic acid derivatives (for example in accordance with WO 2006/117052) or the benzanthracenes (e.g. DE 102007024850). Particularly preferred host materials are selected from the classes of the oligoarylenes, containing naphthalene, anthracene, benzanthracene and/or pyrene, or atropisomers of these compounds, the ketones, the phosphine oxides and the sulfoxides. Very particularly preferred host materials are selected from the classes of the oligoarylenes, containing anthracene, benzanthracene and/or pyrene, or atropisomers of these compounds. For the purposes of this invention, an oligoarylene is intended to be taken to mean a compound in which at least three aryl or arylene groups are bonded to one another.

Further preferred host materials for fluorescent emitter are selected, in particular, from compounds of the Formula H-1

$$Ar^4-(Ar^5)_p-Ar^6 \qquad \text{Formula H-1}$$

wherein $Ar^4$, $Ar^5$, $Ar^6$ are on each occurrence, identically or differently, an aryl or heteroaryl group having 5 to 30 aromatic ring atoms, which may be substituted by one or more radicals and is 1, 2, or 3, the sum of the π-electrons in $Ar^4$, $Ar^5$ and $Ar^6$ is at least 30 if p=1 and is at least 36 if p=2 and is at least 42 if p=3.

It is particularly preferred in the host materials of the Formula H-1 for the group $Ar^5$ to stand for anthracene, which may be substituted by one or more radicals $R^1$, and for the groups $Ar^4$ and $Ar^6$ to be bonded in the 9 and 10-positions. Very particularly preferably, at least one of the groups $Ar^4$ and/or $Ar^6$ is a condensed aryl group selected from 1- or 2-naphthyl, 2-, 3- or 9-phenanthrenyl or 2-, 3-, 4-, 5-, 6- or 7-benzanthracenyl, each of which may be substituted by one or more radicals $R^1$. Preferred embodiments of the radicals $R^1$ are disclosed in the documents as mentioned herein, e.g. US 2007/0092753 A1. Anthracene-based compounds are described in US 2007/0092753 A1 and US 2007/0252517 A1, for example 2-(4-methylphenyl)-9,10-di-(2-naphthyl) anthracene, 9-(2-naphthyl)-10-(1,1'-biphenyl)anthracene and 9,10-bis[4-(2,2-diphenylethenyl)phenyl]anthracene, 9,10-diphenylanthracene, 9,10-bis(phenylethynyl)anthracene and 1,4-bis(9'-ethynylanthracenyl)benzene. Preference is also given to host materials containing two anthracene units (US 2008/0193796 A1), for example 10,10'-bis[1,1',4',1"]terphenyl-2-yl-9,9'-bisanthracenyl.

Further preferred host materials are derivatives of arylamine, styrylamine, fluorescein, perynone, phthaloperynone, naphthaloperynone, diphenylbutadiene, tetraphenylbutadiene, cyclopentadienes, tetraphenylcyclopentadiene, pentaphenylcyclopentadiene, coumarine, oxadiazole, bisbenzoxazoline, oxazone, pyridine, pyrazine, imine, benzothiazole, benzoxazole, benzimidazole (US 2007/0092753 A1), for example 2,2',2"-(1,3,5-phenylene)tris[1-phenyl-1H-benzimidazole], aldazines, stilbene, styrylarylene derivatives, for example 9,10-bis[4-(2,2-diphenylethenyl)phenyl]anthracene, and distyrylarylene derivatives (U.S. Pat. No. 5,121,029), diphenylethylene, vinylanthracene, diaminocarbazole, pyran, thiopyran, diketopyrrolopyrrole, polymethine, mellocyanine, acridone, quinacridone, cinnamic acid esters and fluorescent dyes.

Particular preference is given to derivatives of arylamine and styrylamine, for example 4,4'-bis[N-(1-naphthyl)-N-(2-naphthyl)amino]biphenyl (TNB).

Preferred compounds with oligoarylene as hosts for fluorescent emitter are compounds as disclosed in, e.g., US 2003/0027016 A1, U.S. Pat. No. 7,326,371 B2, US 2006/043858 A, U.S. Pat. No. 7,326,371 B2, US 2003/0027016 A1, WO 2007/114358, WO 2008/145239, JP 3148176 B2, EP 1009044, US 2004/018383, WO 2005/061656 A1, EP 0681019B1, WO 2004/013073A1, U.S. Pat. No. 5,077,142, WO 2007/065678, and US 2007/0205412 A1. Particularly preferred oligoarylene-based compounds are compounds having the Formulae H-2 to H-8.

Formula H-2

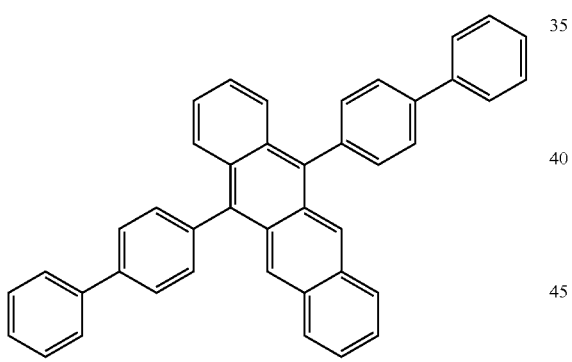

Formula H-3

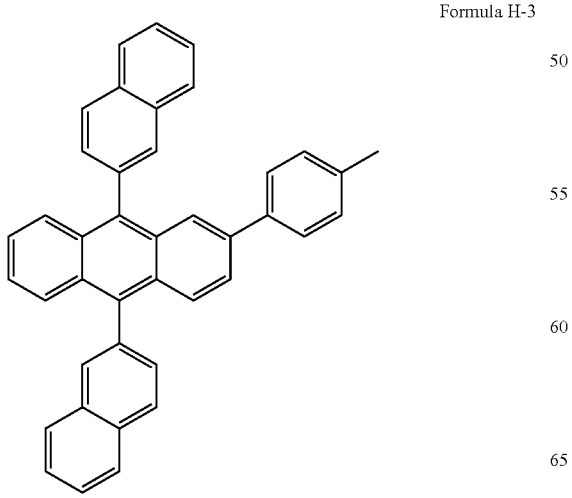

Formula H-4

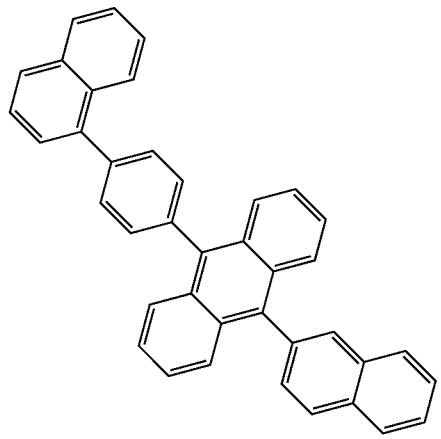

Formula H-5

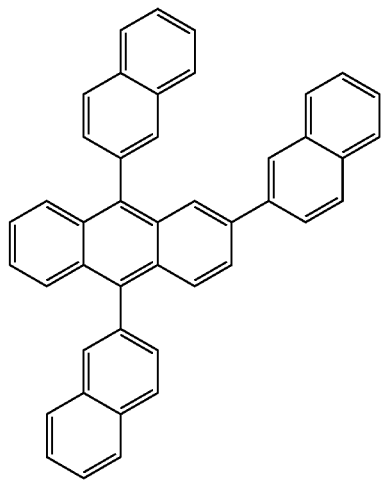

Formula H-6

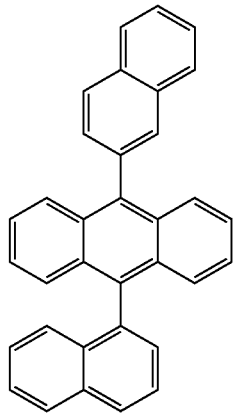

Formula H-7

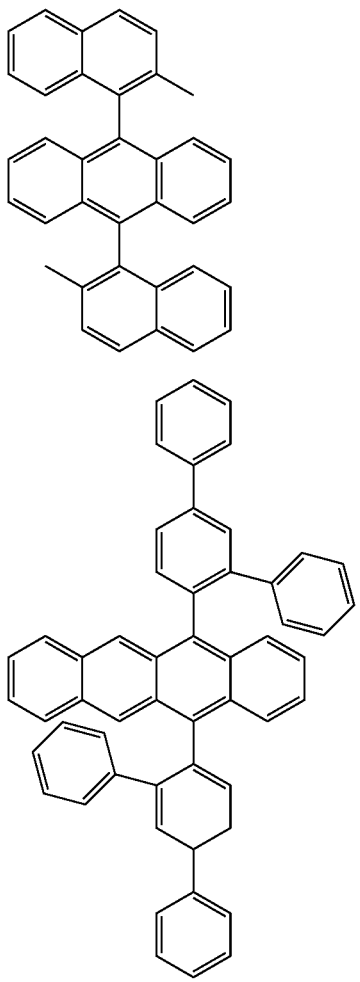

Formula H-8

Further host materials for fluorescent emitter can be selected from spirobifluorene and derivates thereof, for example Spiro-DPVBi as disclosed in EP 0676461 and indenofluorene as disclosed in U.S. Pat. No. 6,562,485.

The preferred host materials for phosphorescent emitter, i.e. matrix materials, are selected from ketones, carbazoles, triarylamines, indenofluorenes, fluorenes, spirobifluorenes, phenathrenes, dehydrophenanthrenes, thiophenes, triazines, imidazoles and their derivatives. Some preferred derivatives are described below in more details.

If a phosphorescent emitter is employed, e.g. as electroluminescent component in organic light emitting diodes (OLEDs), the host material must fulfil rather characteristics as compared to host materials used for fluorescent emitter. The host materials used for phosphorescent emitter are required to have a triplet level which is higher in energy as compared to the triplet level of the emitter. The host material can either transport electrons or holes or both of them. In addition, the emitter is supposed to have large spin-orbital coupling constants in order to facilitate singlet-triplet mixing sufficiently. This can be enabled by using metal complexes.

Preferred matrix materials are N,N-biscarbazolylbiphenyl (CBP), carbazole derivatives (for example in accordance with WO 2005/039246, US 2005/0069729, JP 2004/288381, EP 1205527 or DE 102007002714), azacarbazoles (for example in accordance with EP 1617710, EP 1617711, EP 1731584, JP 2005/347160), ketones (for example in accordance with WO 2004/093207), phosphine oxides, sulfoxides and sulfones (for example in accordance with WO 2005/003253), oligophenylenes, aromatic amines (for example in accordance with US 2005/0069729), bipolar matrix materials (for example in accordance with WO 2007/137725), silanes (for example in accordance with WO 2005/111172), 9,9-diarylfluorene derivatives (e.g. in accordance with DE 102008017591), azaboroles or boronic esters (for example in accordance with WO 2006/117052), triazole derivatives, oxazoles and oxazole derivatives, imidazole derivatives, polyarylalkane derivatives, pyrazoline derivatives, pyrazolone derivatives, distyrylpyrazine derivatives, thiopyran dioxide derivatives, phenylene-diamine derivatives, tertiary aromatic amines, styrylamines, indoles, anthrone derivatives, fluorenone derivatives, fluorenylidenemethane derivatives, hydrazone derivatives, silazane derivatives, aromatic dimethylidene compounds, porphyrin compounds, carbodiimide derivatives, diphenylquinone derivatives, phthalocyanine derivatives, metal complexes of 8 hydroxyquinoline derivatives, such as, for example, Alq$_3$, the 8 hydroxyquinoline complexes may also contain triarylaminophenol ligands (US 2007/0134514 A1), various metal complex-polysilane compounds with metal phthalocyanine, benzoxazole or benzothiazole as ligand, hole-conducting polymers, such as, for example, poly(N-vinylcarbazole) (PVK), aniline copolymers, thiophene oligomers, polythiophenes, polythiophene derivatives, polyphenylene derivatives, polyfluorene derivatives.

Further particularly preferred matrix materials are selected from compounds comprising indolocarbazoles and their derivatives (e.g. Formulae H-9 to H-15), as disclosed for examples in DE 102009023155.2, EP 0906947B1, EP 0908787B1, EP 906948B1, WO 2008/056746A1, WO 2007/063754A1, WO 2008/146839A1, and WO 2008/149691A1.

Formula H-9

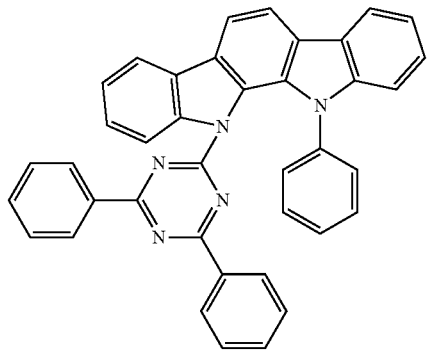

Formula H-10

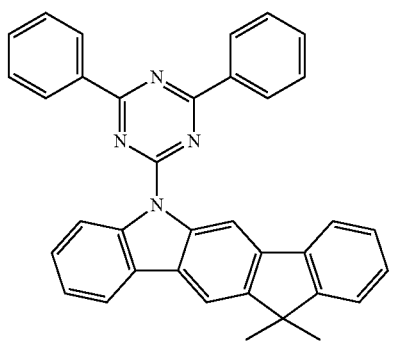

Formula H-11

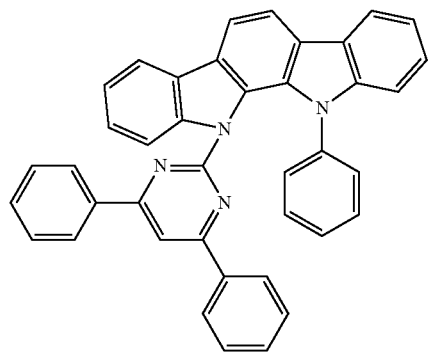

Formula H-12

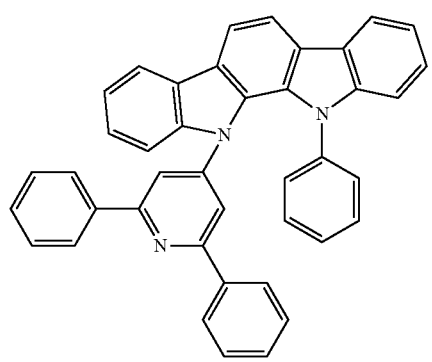

Formula H-13

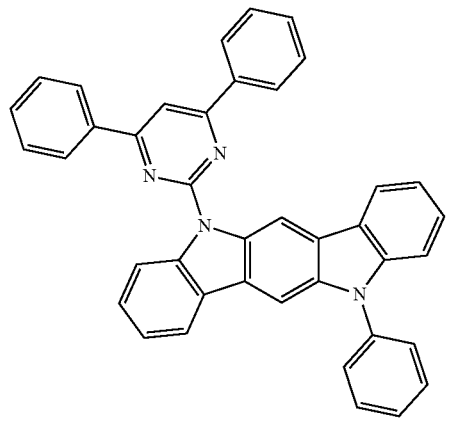

Formula H-14

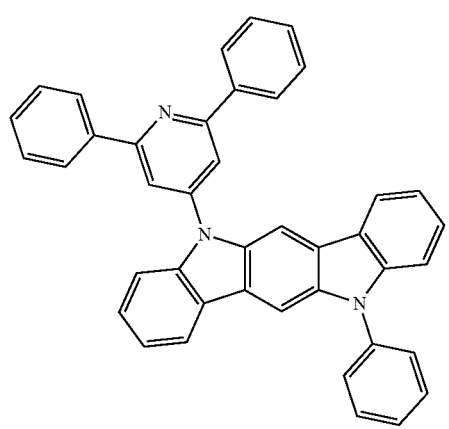

Formula H-15

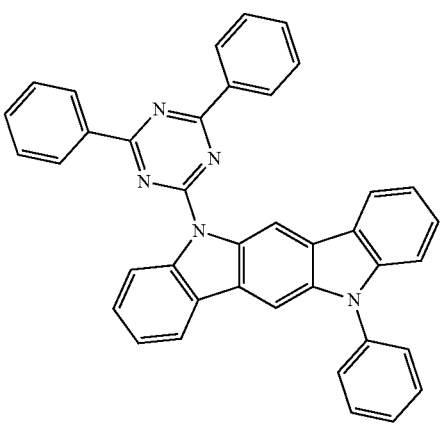

Examples of preferred carbazole derivatives are, 1,3-N,N-dicarbazolebenzene (=9,9'-(1,3-phenylene)bis-9H-carbazole) (mCP), 9,9'-(2,2'-dimethyl[1,1'-biphenyl]-4,4'-diyl)bis-9H-carbazole (CDBP), 1,3-bis(N,N'-dicarbazole)benzene (=1,3-bis(carbazol-9-yl)benzene), PVK (polyvinylcarbazole), 3,5-di(9H-carbazol-9-yl)biphenyl and compounds of the Formulae H-16 to H-20.

Formula H-16

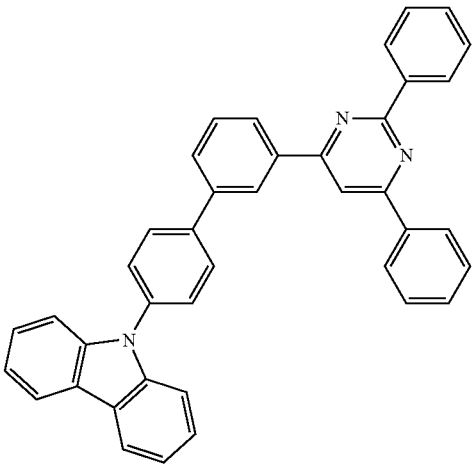

Formula H-17

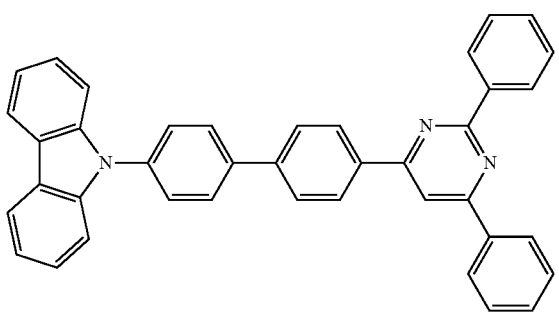

Formula H-18
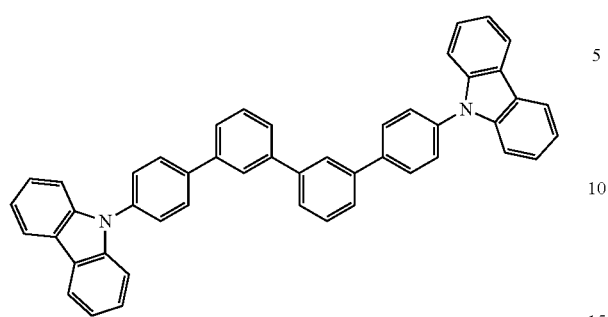
Formula H-22
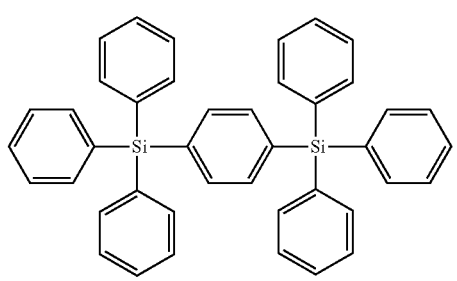
Formula H-19
Formula H-23
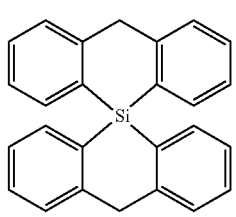
Formula H-20
Formula H-24
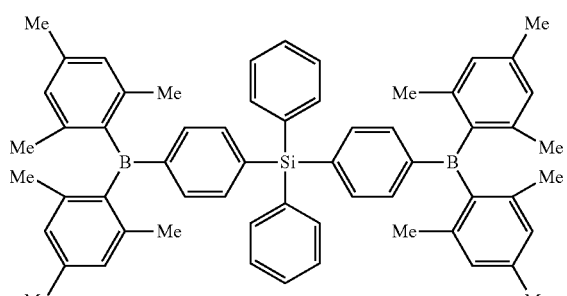
Formula H-25
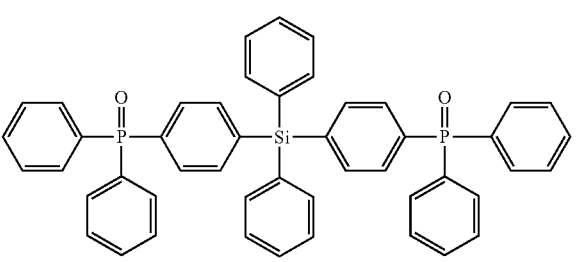
Preferred Si tetraaryl compounds are, for example, (US 2004/0209115, US 2004/0209116, US 2007/0087219 A1, US 2007/0087219 A1) the compounds of the Formulae H-21 to H-26.
Formula H-26
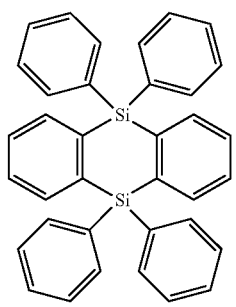
Formula H-21
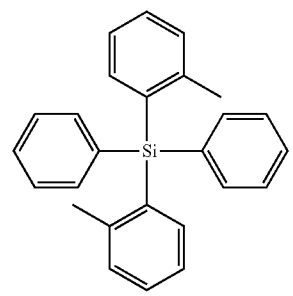
A particularly preferred matrix for phosphorescent dopants is the compound of Formula H-27 (EP 652273 B1)

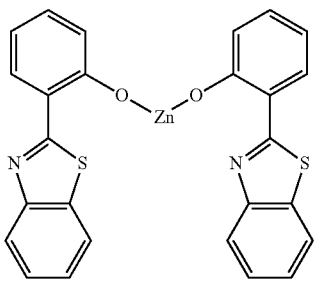

Formula H-27

Further particularly preferred matrix materials for phosphorescent dopants are selected from compounds of the general Formula H-28 (EP 1923448B1).

$$[M(L)_2]_n$$ Formula H-28 wherein M, L, and n are defined as in the reference. Preferably M is Zn, and L is quinolinate, and n is 2, 3 or 4. Very particularly preferred are $[Znq_2]_2$, $[Znq_2]_3$, and $[Znq_2]_4$.

Preference is given to co-hosts selected from metal oxinoid complexes whereby lithium quinolate (Liq) or $Alq_3$ are particularly preferred.

The emitter compound is required to have a smaller band gap as compared to the host compound. In general, smaller band gaps can be achieved by extending the π-electron system of conjugated molecular systems. Emitter compounds tend, therefore, to have more extended conjugated π-electron systems than host molecules. Many examples have been published, e.g. styrylamine derivatives as disclosed in JP 2913116B and WO 2001/021729 A1, and indenofluorene derivatives as disclosed in WO 2008/006449 and WO 2007/140847.

Blue fluorescent emitters are preferably polyaromatic compounds, such as, for example, 9,10-di(2-naphthylanthracene) and other anthracene derivatives, derivatives of tetracene, xanthene, perylene, such as, for example, 2,5,8,11-tetra-t-butylperylene, phenylene, for example 4,4'-(bis(9-ethyl-3-carbazovinylene)-1,1'-biphenyl, fluorene, arylpyrenes (US 2006/0222886), arylenevinylenes (U.S. Pat. Nos. 5,121,029, 5,130,603), derivatives of rubrene, coumarine, rhodamine, quinacridone, such as, for example, N,N'-dimethylquinacridone (DMQA), dicyanomethylenepyrane, such as, for example, 4 (dicyanoethylene)-6-(4-dimethylaminostyryl-2-methyl)-4H-pyrane (DCM), thiopyrans, polymethine, pyrylium and thiapyrylium salts, periflanthene, indenoperylene, bis(azinyl)imine-boron compounds (US 2007/0092753 A1), bis(azinyl)methene compounds and carbostyryl compounds.

Further preferred blue fluorescent emitters are described in C.H. Chen et al.: "Recent developments in organic electroluminescent materials" Macromol. Symp. 125, (1997), 1-48 and "Recent progress of molecular organic electroluminescent materials and devices" Mat. Sci. and Eng. R, 39 (2002), 143-222.

Preferred fluorescent dopants according to the present invention are selected from the class of the monostyrylamines, the distyrylamines, the tristyrylamines, the tetrastyrylamines, the styrylphosphines, the styryl ethers and the arylamines.

A monostyrylamine is taken to mean a compound which contains one substituted or unsubstituted styryl group and at least one, preferably aromatic, amine. A distyrylamine is taken to mean a compound which contains two substituted or unsubstituted styryl groups and at least one, preferably aromatic, amine. A tristyrylamine is taken to mean a compound which contains three substituted or unsubstituted styryl groups and at least one, preferably aromatic, amine. A tetrastyrylamine is taken to mean a compound which contains four substituted or unsubstituted styryl groups and at least one, preferably aromatic, amine. The styryl groups are particularly preferably stilbenes, which may also be further substituted. The corresponding phosphines and ethers are defined analogously to the amines. For the purposes of this invention, an arylamine or an aromatic amine is taken to mean a compound which contains three substituted or unsubstituted aromatic or heteroaromatic ring systems bonded directly to the nitrogen. At least one of these aromatic or heteroaromatic ring systems is preferably a condensed ring system, preferably having at least 14 aromatic ring atoms. Preferred examples thereof are aromatic anthraceneamines, aromatic anthracene-diamines, aromatic pyrene-amines, aromatic pyrene-diamines, aromatic chrysene-amines and aromatic chrysenediamines. An aromatic anthracene-amine is taken to mean a compound in which one diarylamino group is bonded directly to an anthracene group, preferably in the 9 position. An aromatic anthracene-diamine is taken to mean a compound in which two diarylamino groups are bonded directly to an anthracene group, preferably in the 9,10-position. Aromatic pyreneamines, pyrene-diamines, chrysene-amines and chrysene-diamines are defined analogously thereto, where the diarylamino groups on the pyrene are preferably bonded in the 1 position or in the 1,6-position.

Further preferred fluorescent dopants are selected from indenofluoreneamines and indenofluorene-diamines, for example in accordance with WO 2006/122630, benzoindenofluorene-amines and benzoindenofluorenediamines, for example in accordance with WO 2008/006449, and dibenzoindenofluorene-amines and dibenzoindenofluorene-diamines, for example in accordance with WO 2007/140847.

Examples of dopants from the class of the styrylamines are substituted or unsubstituted tristilbene-amines or the dopants described in WO 2006/000388, WO 2006/058737, WO 2006/000389, WO 2007/065549 and WO 2007/115610. Distyrylbenzene and distyrylbiphenyl derivatives are described in US 5121029. Further styrylamines are found in US 2007/0122656 A1.

Particularly preferred styrylamine dopants and triarylamine dopants are the compounds of the Formulae TA-11 to TA-16 and as disclosed in U.S. Pat. No. 7,250,532 B2, DE 102005058557 A1, CN 1583691 A, JP 08053397 A, U.S. Pat. No. 6,251,531 B1, and US 2006/210830 A.

Formula TA-11

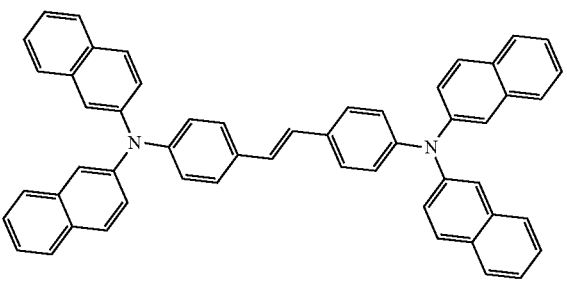

Formula TA-12

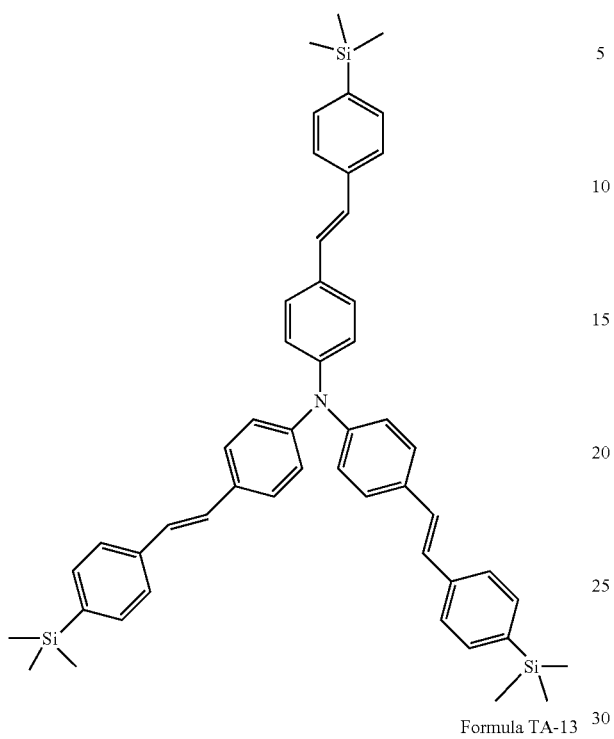

Formula TA-13

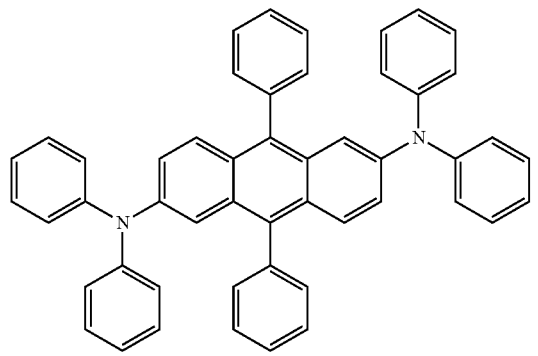

Formula TA-14

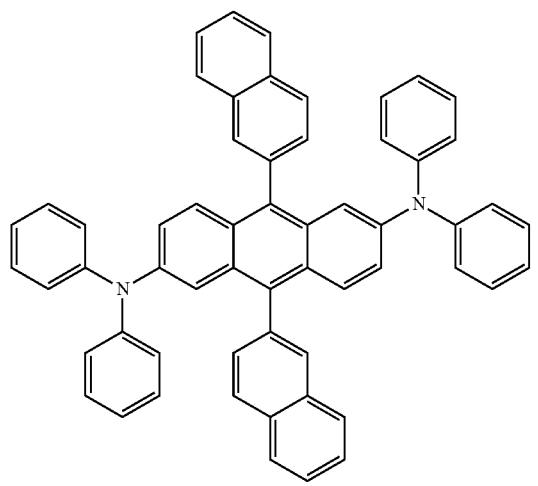

Formula TA-15

Formula TA-16

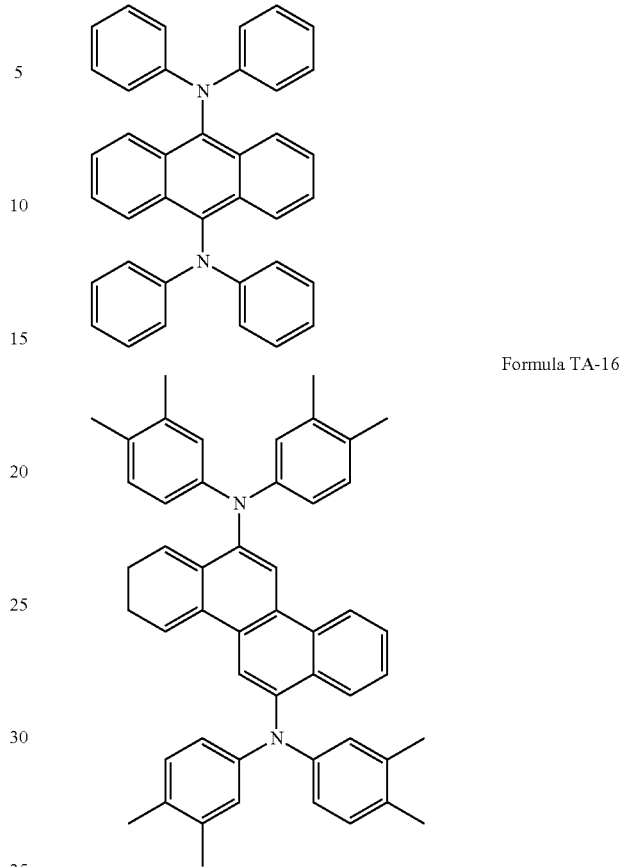

Further preferred fluorescent dopants are selected from the group of triarylamines as disclosed in EP 1957606 A1 and US 2008/0113101 A1.

Further preferred fluorescent dopants are selected from derivatives of naphthalene, anthracene, tetracene, fluorene, periflanthene, indenoperylene, phenanthrene, perylene (US 2007/0252517 A1), pyrene, chrysene, decacyclene, coronene, tetraphenylcyclopentadiene, pentaphenylcyclopentadiene, fluorene, spirofluorene, rubrene, coumarine (U.S. Pat. Nos. 4,769,292, 6,020,078, US 2007/0252517 A1), pyran, oxazone, benzoxazole, benzothiazole, benzimidazole, pyrazine, cinnamic acid esters, diketopyrrolopyrrole, acridone and quinacridone (US 2007/0252517 A1).

Of the anthracene compounds, particular preference is given to 9,10-substituted anthracenes, such as, for example, 9,10-diphenylanthracene and 9,10-bis(phenylethynyl)anthracene. 1,4-Bis(9'-ethynylanthracenyl)benzene is also a preferred dopant.

Examples of phosphorescent emitters are revealed by the applications WO 00/70655, WO 01/41512, WO 02/02714, WO 02/15645, EP 1191613, EP 1191612, EP 1191614 and WO 2005/033244. In general, all phosphorescent complexes as used in accordance with the prior art for phosphorescent OLEDs and as are known to the person skilled in the art in the area of organic electroluminescence are suitable, and the person skilled in the art will be able to use further phosphorescent complexes without inventive step.

The phosphorescent emitter may be a metal complex, preferably with the formula $M(L)_z$, wherein M is a metal atom, L is in each occurrence independently of one another an organic ligand that is bonded to or coordinated with M via one, two or more positions, and z is an integer ≥1, preferably 1, 2, 3, 4, 5 or 6, and wherein, optionally, these groups are linked to a polymer via one or more, preferably one, two or three positions, preferably via the ligands L.

M is in particular a metal atom selected from transition metals, preferably selected from transition metals of group VIII, or lanthanoides, or actinides, particularly preferably selected from Rh, Os, Ir, Pt, Pd, Au, Sm, Eu, Gd, Tb, Dy, Re, Cu, Zn, W, Mo, Pd, Ag, or Ru, and very particularly preferably selected from Os, Ir, Ru, Rh, Re, Pd, or Pt. M may also be Zn.

Preferred ligands are 2 phenylpyridine derivatives, 7,8-benzoquinoline derivatives, 2 (2-thienyl)pyridine derivatives, 2 (1-naphthyl)pyridine derivatives or 2 phenylquinoline derivatives. All these compounds may be substituted, for example by fluoro- or trifluoromethyl substituents for blue. Auxiliary ligands are preferably acetylacetonate or picric acid.

Preferably, at least one of the organic semiconducting compounds is an organic phosphorescent compound which emits light and in addition contains at least one atom having an atomic number greater than 38.

Preferably, the phosphorescent compounds are compounds of formulae (P-1) to (P-4):

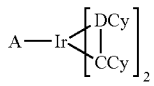

formula (P-1)

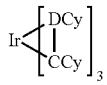

formula (P-2)

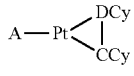

formula (P-3)

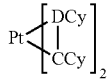

formula (P-4)

where

DCy is, identically or differently on each occurrence, a cyclic group which contains at least one donor atom, preferably nitrogen, carbon in the form of a carbene or phosphorus, via which the cyclic group is bonded to the metal, and which may in turn carry one or more substituents $R^a$; the groups DCy and CCy are connected to one another via a covalent bond;

CCy is, identically or differently on each occurrence, a cyclic group which contains a carbon atom via which the cyclic group is bonded to the metal and which may in turn carry one or more substituents $R^{a-}$;

A is, identically or differently on each occurrence, a monoanionic, bidentate chelating ligand, preferably a diketonate ligand;

$R^a$ are identically or differently at each instance, and are F, Cl, Br, I, $NO_2$, CN, a straight-chain, branched or cyclic alkyl or alkoxy group having from 1 to 20 carbon atoms, in which one or more nonadjacent $CH_2$ groups may be replaced by —O—, —S—, —NR$^b$—, —CONR$^b$—, —CO—O—, —C=O—, —CH=CH— or —C≡C— and in which one or more hydrogen atoms may be replaced by F, or an aryl or heteroaryl group which has from 4 to 14 carbon atoms and may be substituted by one or more $R^c$ radicals, and a plurality of substituents $R^{18}$, either on the same ring or on two different rings, may together in turn form a mono- or polycyclic, aliphatic or aromatic ring system;

$R^b$ are identically or differently at each instance, and are a straight-chain, branched or cyclic alkyl or alkoxy group having from 1 to 20 carbon atoms, in which one or more nonadjacent $CH_2$ groups may be replaced by —O—, —S—, —C=O—, —CH=CH— or —C≡C— and in which one or more hydrogen atoms may be replaced by F, or an aryl or heteroaryl group which has from 4 to 14 carbon atoms and may be substituted by one or more $R^c$ radicals; and $R^c$ are identically or differently at each instance, and are a straight-chain, branched or cyclic alkyl or alkoxy group having from 1 to 20 carbon atoms, in which one or more nonadjacent $CH_2$ groups may be replaced by —O—, —S—, —CO—O—, —C=O—, —CH=CH— —C≡C— or and in which one or more hydrogen atoms may be replaced by F.

The groups as mentioned above are well known in the art. Additional information are provided by the explizit examples as mentioned above and below. Furthermore, spezific examples of the groups CCy, DCy, A, $R^a$, $R^b$ and Rc are provided, e.g. in the document WO2015018480A1 which is expressly incorporated herein by reference for its disclosure regarding phosphorescent compounds.

In particular, complexes of Pt or Pd with tetradentate ligands of the Formula P-5 as disclosed in US 2007/0087219 A1, wherein $R^1$ to $R^{14}$ and $Z^1$ to $Z^5$ are as defined in the reference, Pt porphyrin complexes having an enlarged ring system (US 2009/0061681 A1) and Ir complexes are suitable, for example 2,3,7,8,12,13,17,18-octaethyl-21H, 23H-porphyrin-Pt(II), tetraphenyl-Pt(II)-tetrabenzoporphyrin (US 2009/0061681 A1), cis-bis(2-phenylpyridinato-N,C2') Pt(II), cis-bis(2-(2'-thienyl)pyridinato-N,C3')Pt(II), cis-bis (2-(2'-thienyl)quinolinato-N,C5')Pt(II), (2-(4,6-difluorophenyl)pyridinato-N,C2')Pt(II) acetylacetonate, or tris(2-phenylpyridinato-N,C2')Ir(III) (Ir(ppy)$_3$, green), bis(2-phenylpyridinato-N,C2)Ir(III) acetylacetonate (Ir(ppy)$_2$ acetylacetonate, green, US 2001/0053462 A1, Baldo, Thompson et al. Nature 403, (2000), 750-753), bis(1-phenylisoquinolinato-N,C2')(2-phenylpyridinato-N,C2')iridium (III), bis(2-phenylpyridinato-N,C2')(1-phenylisoquinolinato-N,C2')iridium(III), bis(2-(2'-benzothienyl)pyridinato-N,C3')iridium(III) acetylacetonate, bis(2-(4',6'-difluorophenyl)pyridinato-N,C2')iridium(III) piccolinate (Firpic, blue), bis(2-(4',6'-difluorophenyl)pyridinato-N,C2') Ir(III) tetrakis(1-pyrazolyl)borate, tris(2-(biphenyl-3-yl)-4-tert-butylpyridine)iridium(III), (ppz)$_2$Ir(5phdpym) (US 2009/0061681 A1), (45ooppz)$_2$Ir(5phdpym) (US 2009/0061681 A1), derivatives of 2 phenylpyridine-Ir complexes, such as, for example, iridium(III) bis(2-phenylquinolyl-N, C2')acetylacetonate (PQIr), tris(2-phenylisoquinolinato-N, C)Ir(III) (red), bis(2-(2'-benzo[4,5-a]thienyl)pyridinato-N, C3)Ir acetylacetonate ([Btp2Ir(acac)], red, Adachi et al. Appl. Phys. Lett. 78 (2001), 1622-1624).

Formula P-5

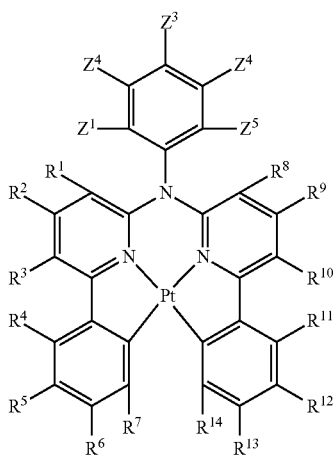

Also suitable are complexes of trivalent lanthanides, such as, for example, Tb³⁺ and Eu³⁺ (J. Kido et al. Appl. Phys. Lett. 65 (1994), 2124, Kido et al. Chem. Lett. 657, 1990, US 2007/0252517 A1), or phosphorescent complexes of Pt(II), Ir(I), Rh(I) with maleonitrile dithiolate (Johnson et al., JACS 105, 1983, 1795), Re(I) tricarbonyl diimine complexes (Wrighton, JACS 96, 1974, 998 inter alia), Os(II) complexes with cyano ligands and bipyridyl or phenanthroline ligands (Ma et al., Synth. Metals 94, 1998, 245) or $Alq_3$ without a host.

Further phosphorescent emitters with tridentate ligands are described in U.S. Pat. Nos. 6,824,895 and 7,029,766. Red-emitting phosphorescent complexes are mentioned in U.S. Pat. Nos. 6,835,469 and 6,830,828.

A particularly preferred phosphorescent dopant is a compound with the Formula P-6 and further compounds as disclosed, e.g., in US 2001/0053462 A1.

A particularly preferred phosphorescent dopant is a compound with the Formula P-7 and further compounds as disclosed, e.g., in WO 2007/095118 A1

Formula P-6

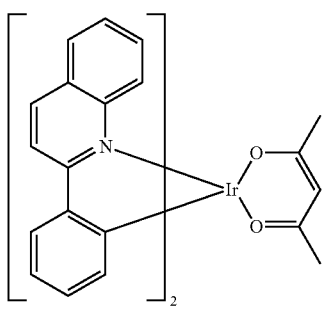

Formula P-7

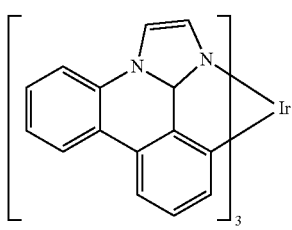

Further derivatives are described in U.S. Pat. No. 7,378, 162 B2, U.S. Pat. No. 6,835,469 B2, and JP 2003/253145 A.

Further to metal complex mentioned elsewhere herein, a suitable metal complex according to the present invention can be selected from transition metals, rare earth elements, lanthanides and actinides is also subject of this invention. Preferably the metal is selected from Ir, Ru, Os, Eu, Au, Pt, Cu, Zn, Mo, W, Rh, Pd, or Ag.

Formulations according to the present invention may comprise organic semiconducting material which is selected from small molecules, polymers, oligomers, dendrimers, and blends. Preferably, the present formulation may comprise a polymeric organic semiconducting compound. The organic semiconducting polymer is characterized in that different functions may be incorporated into one large molecule or a blend of large molecules. The functions are, inter alia, the ones of a hole injection material, hole transport material, electron blocking material, emissive material, hole blocking material, electron injection material, electron transport material, and dye. The functions which are incorporated into a polymer can be categorized into different groups. By choosing the desired functional groups and the ratio between them, the polymer can be tuned to have the desired function(s).

The difference between polymers, oligomers and dendrimers is due to the size, size distribution, and branching of the molecular entities as defined above.

Different structures are, inter alia, those as disclosed and extensively listed in WO 2002/077060 A1 and in DE 10337346 A1. The structural units may originate, for example, from the following groups:

Group 1: units which increase the hole-injection and/or transport properties of the polymers; It corresponds to the HIMs or HTMs as described above.

Group 2: units which increase the electron-injection and/ or transport properties of the polymers; It corresponds to the EIMs or ETMs as described above.

Group 3: units which have combinations of individual units from group 1 and group 2;

Group 4: units which modify the emission characteristics to such an extent that electrophosphorescence may be obtained instead of electrofluorescence; typically, it corresponds to the phosphorescent emitter, or more preferably emissive metal complexes as described above.

Group 5: units which improve the transition from the so called singlet state to higher spin states, e.g. to a triplet state;

Group 6: units which influence the morphology and/or emission colour of the resultant polymers;

Group 7: units which are typically used as backbone and which may have electron transport function, hole transport function or both.

Group 8: units which have strong absorption in at least one wavelength from UV to infrared. It corresponds to the dye materials as described above.

Preferably, the said polymeric organic semiconducting material is a hole transport or injection polymer comprising units of groups 1, which are preferably selected from units comprising the low molecular weight HTMs or HIMs as described above.

Further preferred units from group 1 are, for example, triarylamine, benzidine, tetraaryl-para-phenylenediamine, carbazole, azulene, thiophene, pyrrole and furan derivatives and further O, S or N containing heterocycles with a high HOMO. These arylamines and heterocycles preferably result in an HOMO in the polymer of greater than 5.8 eV (against vacuum level), particularly preferably greater than 5.5 eV.

Preferred polymeric HTM or HIM is a polymer comprising at least one of following repeat unit according to Formulae HTP-1.

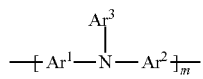

Formula HTP-1 wherein

Ar$^1$ which may be the same or different, denote, independently if in different repeat units, a single bond or an optionally substituted mononuclear or polynuclear aryl group, Ar$^2$ which may be the same or different, denote, independently if in different repeat units, an optionally substituted mononuclear or polynuclear aryl group, Ar$^3$ which may be the same or different, denote, independently if in different repeat units, an optionally substituted mononuclear or polynuclear aryl group, m is 1, 2 or 3.

Particularly preferred units of Formula HTP-1A are selected from the group consisting of the Formulae HTP-1A to HTP-1C:

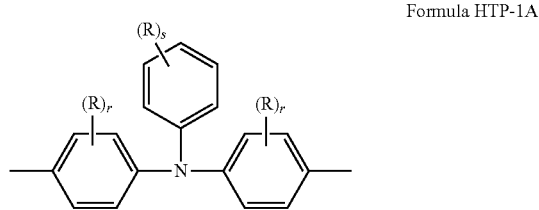

Formula HTP-1A

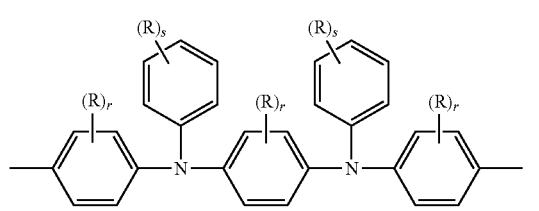

Formula HTP-1B

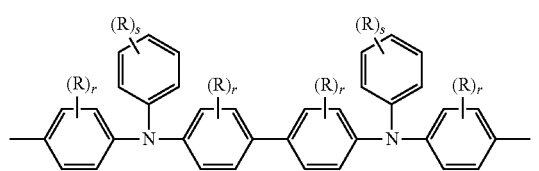

Formula HTP-1C wherein

R which may be the same or different in each occurrence, is selected from H, substituted or unsubstituted aromatic or heteroaromatic group, alkyl, cycloalkyl, alkoxy, aralkyl, aryloxy, arylthio, alkoxycarbonyl, preferably having 1 to 40 C atoms, silyl, carboxy group, a halogen atom, cyano group, nitro group or hydroxy group, r is 0, 1, 2, 3 or 4, and s is 0, 1, 2, 3, 4 or 5.

Further preferred polymeric HTM or HIM is a polymer comprising at least one of following repeat unit according to Formulae HTP-2.

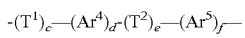

Formula HTP-2 wherein

T$^1$ and T$^2$ are independently of each other selected from thiophene, selenophene, thieno[2,3b]thiophene, thieno[3,2b]thiophene, dithienothiophene, pyrrole, aniline, all of which are optionally substituted with R$^5$, R$^5$ is in each occurrence independently of each other selected from halogen, —CN, —NC, —NCO, —NCS, —OCN, SCN, C(=O)NR$^0$R$^{00}$, —C(=O)X, —C(=O)R$^0$, —NH$_2$, —NR$^0$R$^{00}$, SH, SR$^0$, —SO$_3$H, —SO$_2$R$^0$, —OH, —NO$_2$, —CF$_3$, —SF$_5$, optionally substituted silyl, or carbyl or hydrocarbyl with 1 to 40 C atoms that is optionally substituted and optionally contains one or more hetero atoms, Ar$^4$ and Ar$^5$ are independently of each other mononuclear or polynuclear aryl or heteroaryl, which is optionally substituted and optionally fused to the 2,3-positions of one or both of the adjacent thiophene or selenophene groups, c and e are independently of each other 0, 1, 2, 3 or 4, with 1<c+e≤6, d and f are independently of each other 0, 1, 2, 3 or 4.

Examples for polymeric HTMs are as disclosed in WO 2007131582 A1 and WO 2008/009343A1.

Preferably, the said polymeric organic semiconducting material is an electron transport or injection polymer comprising groups 2, which is preferably selected from groups comprising the low molecular weight ETMs or EIMs as described above.

Further preferred units from group 2, which have electron-injection or electron-transport properties, are, for example, pyridine, pyrimidine, pyridazine, pyrazine, oxadiazole, quinoline, quinoxaline and phenazine derivatives, but also triarylboranes and further O, S or N containing heterocycles having a low LUMO. These units in the polymer preferably result in an LUMO of less than 2.7 eV (against vacuum level), particularly preferably less than 2.8 eV.

Preferably, the said polymeric organic semiconducting material is a polymer comprising units from group 3 in which structures which increase the hole mobility and the electron mobility (i.e. units from groups 1 and 2) are bonded directly to one another. Some of these units may serve as emitters and shift the emission colour into the green, yellow or red. Their use is thus suitable, for example, for the production of other emission colours or a broad-band emission from originally blue-emitting polymers.

Preferably, the said polymeric organic semiconducting material is a polymer comprising units of group 4, which is preferably selected from the groups comprising phosphorescent emitter, particularly emissive metal complexes as described above. Particular preference is given here to corresponding structural units which contain elements from groups 8 to 10 (Ru, Os, Rh, Ir, Pd, Pt).

Preferably, the said polymeric organic semiconducting material is a polymeric triple matrix comprising units of group 5, which can improve the transition from the singlet state to the triplet state and which, employed in support of the structural elements from group 4, improve the phosphorescence properties of these structural elements. Suitable for this purpose are, in particular, carbazole and bridged carbazole dimer units, as described in DE 10304819 A1 and DE 10328627 A1. Also suitable for this purpose are ketones, phosphine oxides, sulfoxides, sulfones, silane derivatives and similar compounds, as described in DE 10349033 A1. Further preferred structure units can be selected from groups comprising the low molecular weight phosphorescent matrices as described above.

Preferably, the said polymeric organic semiconducting material is a polymer comprising units of group 6, which influence the morphology and/or emission colour of the polymers, are, besides those mentioned above, those which have at least one further aromatic or another conjugated structure which do not fall under the above-mentioned groups, i.e. which have only little effect on the charge-carrier mobilities, which are not organometallic complexes or which have no influence on the singlet-triplet transition. Structural elements of this type may influence the morphology and/or emission colour of the resultant polymers. Depending on the unit, they can therefore also be employed as emitters. Preference is given here, in the case of fluorescent OLEDs, to aromatic structures having 6 to 40 C atoms or also tolan, stilbene or bisstyrylarylene derivatives, each of which may be substituted by one or more radicals R1. Particular preference is given here to the incorporation of 1,4-phenylene, 1,4-naphthylene, 1,4- or 9,10-anthrylene, 1,6-, 2,7- or 4,9-pyrenylene, 3,9- or 3,10-perylenylene, 4,4'-biphenylylene, 4,4"-terphenylylene, 4,4' bi 1,1'-naphthylylene, 4,4'-tolanylene, 4,4'-stilbenylene or 4,4"-bisstyrylarylene derivatives.

Preferably, the said polymeric organic semiconducting material is a polymer comprising units of group 7 which contain aromatic structures having 6 to 40 C atoms which are typically used as polymer backbone. These are, for example, 4,5-dihydropyrene derivatives, 4,5,9,10-tetrahydropyrene derivatives, fluorene derivatives as disclosed for example in U.S. Pat. No. 5,962,631, WO 2006/052457 A2 and WO 2006/118345A1, 9,9'-spirobifluorene derivatives as disclosed for example in WO 2003/020790 A1, 9,10-phenanthrene derivatives as disclosed, for example, in WO 2005/104264 A1, 9,10-dihydrophenanthrene derivatives as disclosed for example in WO 2005/014689 A2, 5,7-dihydrodibenzooxepine derivatives and cis- and trans-indenofluorene derivatives as disclosed for example in WO 2004041901 A1, WO 2004113412 A2 and, binaphthylene derivatives as disclosed for example in WO 2006/063852 A1, and further units as disclosed for example in WO 2005/056633A1, EP 1344788A1 and WO 2007/043495A1, WO 2005/033174 A1, WO 2003/099901A1 and DE 102006003710.3.

Further preferred structural elements from group 7 are selected from fluorene derivatives, as disclosed for example in U.S. Pat. No 5,962,631, WO 2006/052457 A2 and WO 2006/118345 A1, spiro-bifluorene derivatives as disclosed for example in WO 2003/020790 A1, benzofluorene, dibenzofluorene, benzothiophene, dibenzofluorene and their derivatives as disclosed for example in WO 2005/056633A1, EP 1344788A1 and WO 2007/043495A1

Very preferred structural elements of group 7 are those of Formula PB-1:

Formula PB-1

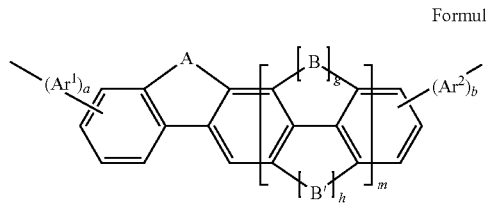

wherein

A, B and B' are independently of each other, and in case of multiple occurrence independently of one another, a divalent group, preferably selected from —CR$^1$R$^2$—, —NR$^1$—, —PR$^1$—, —O—, —S—, —SO—, —SO$_2$—, —CO—, —CS—, —CSe—, —P(=O)R$^1$—, —P(=S)R$^1$— and —SiR$^1$R$^2$—, R$^1$ and R$^2$ are independently of each other identical or different groups selected from H, halogen, —CN, —NC, —NCO, —NCS, —OCN, —SCN, —C(=O)NR$^0$R$^{00}$, —C(=O)X, —C(=O)R$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, optionally substituted silyl, or carbyl or hydrocarbyl with 1 to 40 C atoms that is optionally substituted and optionally comprises one or more hetero atoms, and optionally the groups R$^1$ and R$^2$ form a Spiro group with the fluorene moiety to which they are attached, X is halogen, R$^0$ and R$^{00}$ are independently of each other H or an optionally substituted carbyl or hydrocarbyl group optionally comprising one or more hetero atoms, each g is independently 0 or 1 and each corresponding h in the same subunit is the other of 0 or 1, m is an integer ≥1

Ar$^1$ and Ar$^2$ are independently of each other mono- or polynuclear aryl or heteroaryl that is optionally substituted and optionally fused to the 7,8-positions or 8,9-positions of the indenofluorene group, a and b are independently of each other 0 or 1.

If the groups R$^1$ and R$^2$ form a spiro group with the fluorene group to which they are attached, it is preferably spirobifluorene.

The groups of Formula PB-1 are preferably selected from the following Formulae PB-1A to PB-1E:

Formula PB-1A

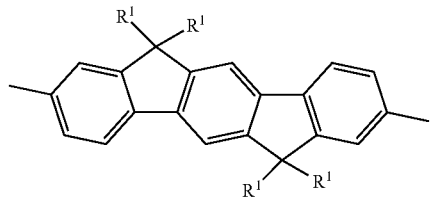

Formula PB-1B

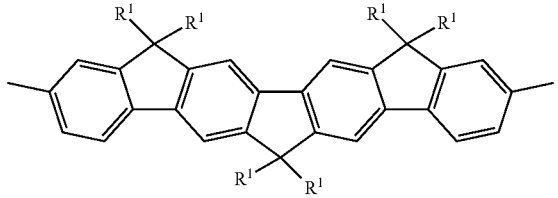

Formula PB-1C

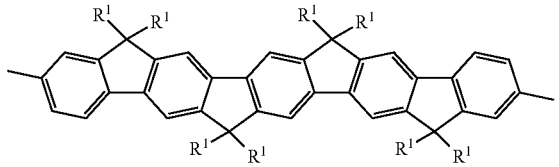

Formula PB-1D

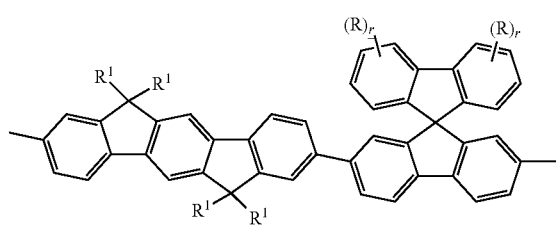

Formula PB-1E

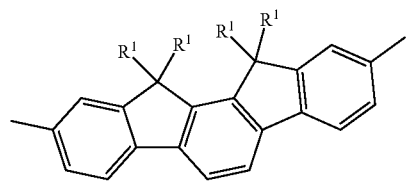

wherein R¹ is as defined in Formula PB-1, r is 0, 1, 2, 3 or 4, and R has one of the meanings of R¹.

R is preferably F, Cl, Br, I, —CN, —NO$_2$, —NCO, —NCS, —OCN, —SCN, —C(=O)NR$^O$R$^{OO}$, —C(=O)X$^O$, —C(=O)R$^O$, —NR$^O$R$^{OO}$, optionally substituted silyl, aryl or heteroaryl with 4 to 40, preferably 6 to 20 C atoms, or straight chain, branched or cyclic alkyl, alkoxy, alkylcarbonyl, alkoxycarbonyl, alkylcarbonlyoxy or alkoxycarbonyloxy with 1 to 20, preferably 1 to 12 C atoms, wherein one or more H atoms are optionally replaced by F or Cl, and wherein R$^O$, R$^{OO}$ and X$^O$ are as defined above.

Particularly preferred groups of Formula 67 are selected from the following Formulae PB-1F to PB-1I:

Formula PB-1F

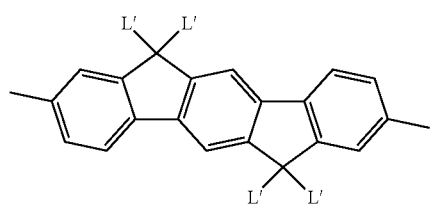

Formula PB-1G

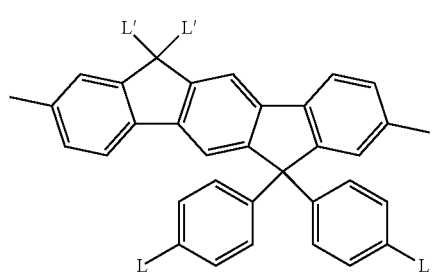

Formula PB-1H

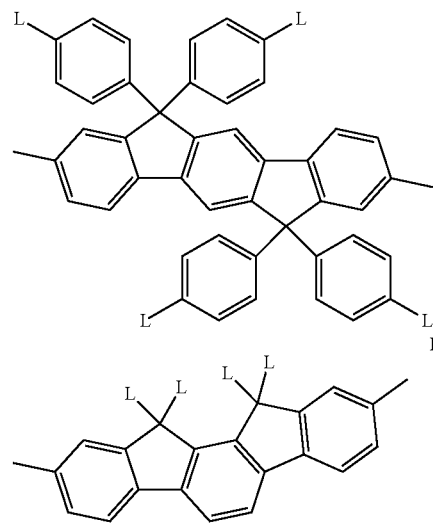

Formula PB-1I wherein
L is H, halogen or optionally fluorinated, linear or branched alkyl or alkoxy with 1 to 12 C atoms, and is preferably H, F, methyl, i-propyl, t-butyl, n-pentoxy, or trifluoromethyl, and L' is optionally fluorinated, linear or branched alkyl or alkoxy with 1 to 12 C atoms, and is preferably n-octyl or n-octyloxy. Preferably, the said polymeric organic semiconducting material is a polymer comprising group 8, which can be selected from the groups comprising the dye materials as described above. The conjugated polymers suitable for organic solar cells, as summarized for example by F.C. Krebs, in Solar Energy Materials and Solar Cells, Vol91, 953 (2007), can also be used as the said further organic semiconducting material in the present invention.

Preference is given to polymers suitable for use in the invention which simultaneously comprise one or more units selected from groups 1 to 8. It may likewise be preferred for more than one structural unit from a group to be present simultaneously.

Preference is given to polymers suitable for use in the invention which, besides structural units of an emitter, also comprise at least one structural unit from the above-mentioned groups. At least two structural units are particularly preferably from different classes of those mentioned above.

The proportion of the different classes of groups, if present in the polymer, is preferably in each case at least 5 mol %, particularly preferably in each case at least 10 mol %. In particular, one of these structural units is selected from the group of hole-conducting units and the other group is an emitting unit, where these two functions (hole conduction and emission) may also be taken on by the same unit.

However, a smaller proportion of the emitting units, in particular green- and red-emitting units, may also be preferred, for example for the synthesis of white-emitting copolymers. The way in which white-emitting copolymers can be synthesised is described in detail in DE 10343606 A1.

In order to ensure adequate solubility, it is preferred for on average at least 2 non-aromatic C atoms to be present in the substituents per recurring unit. Preference is given here to at least 4 and particularly preferably at least 8 C atoms. In addition, individual C atoms of these may be replaced by O or S. However, it is entirely possible for this to mean that a certain proportion of recurring units does not carry any further non-aromatic substituents.

In order to avoid impairing the morphology of the film, it is preferred to have no long-chain substituents having more than 12 C atoms in a linear chain, particularly preferably none having more than 8 C atoms and in particular none having more than 6 C atoms.

The polymer used as polymeric organic semiconducting material in the invention may be statistical or random copolymers, alternating or regioregular copolymers, block copolymers or combinations thereof.

In another preferred embodiment, the said polymer is a side-chain non-conjugated polymer, which is especially important for phosphorescent OLEDs based on polymer. In general, such phosphorescent polymer is obtained by means of radical copolymerization of vinyl compounds, and comprises at least one phosphorescent emitter and at least one charge transport unit on side chain, as disclosed in U.S. Pat. No. 7,250,226 B2. Further examples for such phosphorescent polymer are disclosed for example in JP 2007/211243 A2, JP 2007/197574 A2, US 7250226B2, JP 2007/059939A.

In a further preferred embodiment, the said polymer is a main-chain non-conjugated polymer, where the backbone units are connected by spacer on main-chain. Like side-chain non-conjugated polymer, main-chain non-conjugated polymers give also a high triplet level. An example for triplet OLEDs based on main-chain non-conjugated polymers is disclosed in DE 102009023154.4.

In a further embodiment, the said polymer can also be a non-conjugated polymer for fluorescent OLEDs. Preferred singlet non-conjugated polymers are, for example, side-chain polymers with antracenenes, benzanthrecenes and their derivates in the side-chain, as disclosed in JP 2005/108556, JP 2005/285661, JP 2003/338375 etc.

The said polymers can also act as ETM or HTM, preferably the polymer is a non-conjugated polymer.

According to a preferred embodiment of the present invention, the formulation may comprise at least a third organic semiconducting compound (OSC-3) having a high solubility in the second organic solvent (S-2). With respect to the expression "high solubility" the same definition as outlined for OSC-2 in S-2 applies.

More preferably, the second organic semiconducting compound (OSC-2) is an emitter, preferably a phosphorescent emitter and the third organic semiconducting compound (OSC-3) is an emitter, preferably a phosphorescent emitter, an electron transport material (ETM), a hole transport material (HTM) and/or a wide band gap compound.

In a further embodiment the formulation may comprise at least a fourth organic semiconducting compound (OSC-4) having a high solubility in the second organic solvent (S-2). With respect to the expression "high solubility" the same definition as outlined for OSC-2 in S-2 applies.

Especially preferably, the second organic semiconducting compound (OSC-2) is an emitter, preferably a phosphorescent emitter and the third organic semiconducting compound (OSC-3) is a wide band gap compound and the fourth organic semiconducting compound (OSC-4) is an electron transport material (ETM) and/or a hole transport material (HTM), very preferably OSC-4 is an ETM.

In a further embodiment the formulation may comprise at least a fourth organic semiconducting compound (OSC-4) having a high solubility in the second organic solvent (S-2). With respect to the expression "high solubility" the same definition as outlined for OSC-2 in S-2 applies.

Especially preferably, the first organic semiconducting compound (OSC-1) is a hole transport material (HTM) and the second organic semiconducting compound (OSC-2) is an emitter, preferably a phosphorescent emitter, and the third organic semiconducting compound (OSC-3) is a wide band gap compound and the fourth organic semiconducting compound (OSC-4) is an electron transport material (ETM) and/or a hole transport material (HTM), very preferably OSC-4 is an ETM According to a. further aspect of the present invention, the second organic semiconducting compound (OSC-2) preferably is an emitter, preferably a phosphorescent emitter and wherein the first organic semiconducting compound (OSC-1) is a charge transporting compound, preferably a hole transporting material (HTM).

Preferably, the second organic semiconducting compound (OSC-2) is an electron transport material (ETM) and/or a hole blocking material (HBM) and wherein the first organic semiconducting is an emitter, preferably a phosphorescent emitter.

Preferably, the second organic semiconducting compound (OSC-2) is an electron injection material (EIM) and wherein the first organic semiconducting is an electron transport material (ETM) and/or a hole blocking material (HBM).

Any two layers that typically are adjacent in organic electronic devices can be prepared according to the formulations and techniques as disclosed herein. Organic electroluminescent devices typically exhibit the following structure, wherein additional layers or less layers are possible as well: anode/HIUHTL/EMUHBL/ETL/EIL/cathode, wherein the emissive layer is denoted by EML. Thus, HIL/HTL, HTL/EML, EML/HBL, EML/ETL and ETL/EIL represent pairs of layers that can be prepared with a single formulation according to the invention. One skilled person can easily adapt the disclosure herein to manufacture a formulation suitable for the production of a pair of two layers. The first layer that is deposited is based on the first solvent having the lower boiling point and the organic semiconducting materials that show high solubility in the first solvent.

The second layer that is deposited is based on the second solvent having the higher boiling point and the organic semiconducting materials that show high solubility in the second solvent.

Devices according to the present invention may also comprise additional layer which were not deposited by using a formulation, i.e. a solution or emulsion according to this invention. The additional layer may be deposited by a technique from solution or by vapour deposition. Hereby the specific method employed depends on the characteristics of the material used and a person skilled in the art has no problem to select the appropriate technique. The material which is deposited can be any material used in the field of electronic and opto-electronic multilayer structures. In particular the material may be any material described herein. Furthermore, the materials may be selected from organic and inorganic functional materials as outlined below.

Inorganic compounds, such as p type Si and p type SiC, and inorganic oxides, e.g., vanadium oxide ($VO_x$), molybdenum oxide ($MoO_x$) or nickel oxide ($NiO_x$) can also be used as HIM.

Electron injection layers (EILs) are often constructed from an insulator and semiconductor.

Preferred alcali metal chalcogenides for EILs are $Li_2O$, LiO, $Na_2S$, $Na_2Se$, NaO, $K_2O$, $Cs_2O$.

Preferred alkaline-earth metal chalcogenides for EILs are CaO, BaO, SrO, BeO, BaS, CaSe.

Preferred halides of alkali metals for EILs are LiF, NaF, KF, CsF, LiCl, KCl, NaCl.

Preferred halides of alkaline-earth metals for EILs are $CaF_2$, $BaF_2$, $SrF_2$, $MgF_2$, $BeF_2$.

It is likewise possible to employ alkali metal complexes, alkaline-earth metal complexes, rare-earth metals (Sc, Y, Ce, Th, Yb), rare-earth metal complexes, rare-earth metal compounds (preferably $YbF_3$, $ScF_3$, $TbF_3$) or the like.

The structure of EILs is described, for example, in U.S. Pat. Nos. 5,608,287, 5,776,622, 5,776,623, 6,137,223, 6,140,763, 6,914,269.

An electron-transport layer may consist of an intrinsic material or comprise a dopant. $Alq_3$ (EP 278757 B1) and Liq (EP 0569827 A2) are examples of intrinsic layers. 4,7-diphenyl-1,10-phenanthroline (Bphen):Li 1:1 (US 2003/02309890) and rubrene/LiF are examples of doped layers.

In addition to the materials mentioned above, an organic electroluminescent device according to the present invention may comprise at least one anode, at least one cathode and one or more substrates.

Preferred materials for the anode are metal oxides selected from, but not limited to, indium tin oxide (ITO), indium zinc oxide (IZO), tin oxide (SnO), ZnO, InO, aluminium-zinc-oxide (AlZnO), and other metal oxides such as Al- and In-zinc oxide doped with zinc oxide, magnesium-indium-oxide, and nickel-tungsten-oxide. Metal nitrides such as galliumnitrides and metal selenides such as zinc-selenide and metal-sulfides such as zinc-sulfide can also be used. Further materials that can be used for anodes are electrically conducting polymers, e.g. polythiophenes and polypyrroles.

The anode can be transparent, opaque, or reflective. The anode can also adopt an intermediate state, e.g. both being partially reflective and partially transparent.

If the anode is not or only partially transparent further conducting materials can be used. Preferred materials for non transparent or partially transparent anodes are selected from, but not limited to, Au, Ir, Mo, Pd, Pt, Cu, Ag, Sn, C, Al, V, Fe, Co, Ni, W, and mixtures thereof. The conducting materials can also be mixed with further conducting materials as described above, e.g. In—Cu.

The anode is preferably transparent and a particularly preferred material for the anode is ITO. In the case of a bottom-emitting device glass or plastic is preferably coated with ITO. In the case of a top-emitting device the anode comprises preferably a reflecting material. Further materials can be used for anodes, which are known to the person skilled in the art.

A flexible and transparent combination of substrate and anode is described in U.S. Pat. No. 5,844,363 B2 and U.S. Pat. No. 6,602,540 B2, for instance.

The cathode can be transparent, opaque, or reflective. The cathode is selected from a metal or an alloy with a low work function. Preferably metals, alloys, or conducting compounds or materials with a work function of less than 4.0 eV are used. Particularly preferred cathodes are selected from, but not limited to, Ba, Ca, Sr, Yb, Ga, Cd, Si, Ta, Sb, Zn, Mg, Al, In, Li, Na, Cs, Ag, mixtures of two or more elements such as alloys comprising Mg/Al or Al/Li or Al/Sc/Li or Mg/Ag or metal oxides such as ITO or IZO.

Further preferred materials for cathodes, used to form a thin dielectric layer, are selected from a metal which is mixed with LiF, $Li_2O$, $BaF_2$, MgO, or NaF. A typical combination is LiF/Al.

An Mg/Al cathode with ITO layer on top is described in U.S. Pat. Nos. 5,703,436, 5,707,745, 6,548,956 B2, U.S. Pat. No. 6,576,134 B2. An Mg/Ag alloy is described in U.S. Pat. No. 4,885,221.

The substrate may be rigid or flexible. It may be transparent, translucent, opaque or reflective. The materials used can be glass, plastic, ceramic or metal foils, where plastic and metal foils are preferably used for flexible substrates. However, semiconductor materials, such as, for example, silicone wafers or printed circuit board (PCB) materials, can also be employed in order to simplify the generation of conductor tracks. Other substrates can also be employed.

The glass used can be, for example, soda-lime glass, Ba- or Sr-containing glass, lead glass, aluminium silicate glass, borosilicate glass, Ba borosilicate glass or quartz.

Plastic plates can consist, for example, of polycarbonate resin, acrylic resin, vinyl chloride resin, polyethylene terephthalate resin, polyimide resin, polyester resin, epoxy resin, phenolic resin, silicone resin, fluorine resin, polyether sulfide resin or polysulfone resin.

For transparent films, use is made, for example, of polyethylene, ethylene-vinyl acetate copolymers, ethylene-vinyl alcohol copolymers, polypropylene, polystyrene, polymethyl methacrylate, PVC, polyvinyl alcohol, polyvinylbutyral, nylon, polyether ether ketone, polysulfone, polyether sulfone, tetrafluoroethylene-perfluoroalkyl vinyl ether copolymers, polyvinyl fluoride, tetrafluoroethylene-ethylene copolymers, tetrafluoroethylene-hexafluoropropylene copolymers, polychlorotrifluoroethylene, polyvinylidene fluoride, polyester, polycarbonate, polyurethanes, polyimide or polyether imide.

The substrate is provided with a hydrophobic layer. The substrates are preferably transparent.

Other materials than those mentioned here can also be used. Suitable materials are known to the person skilled in the art.

If at least two emitter materials are present in the formulation, and preferably both emitters have a high solubility in the second organic solvent (S-2), it is preferable that the absorption spectrum of one emitter overlaps with the photoluminescence (PL) spectrum of another emitter in order to take advantage the Forster energy transfer. PL spectra of the emitter can be measured according to standard techniques well known to a person skilled in the art.

In a preferred embodiment the formulation according to the invention is characterized in that the at least one emitter material is selected from fluorescent and phosphorescent emitter materials and the host material is selected from anthracenes, benzanthracenes, indenofluorenes, fluorenes, spirobifluorenes, phenanthrenes, diehydrophenanthrenes, thiophenes, triazines, imidazole, ketones, carbazoles, triarylamines, and derivatives thereof.

Preference is given to fluorescent emitter and fluorescent host materials. Another subject of the present invention is, therefore, a formulation, characterized in that it comprises in the discontinuous phase at least one fluorescent emitter and at least one host material. Preferably the formulation comprises 3 fluorescent emitter materials and one host material, particularly preferably it comprises 2 fluorescent emitter and one host material, and very particularly preferably it comprises one fluorescent emitter and one host material.

The formulation according to the invention may also comprise one or more additional fluorescent hosts, so called co-hosts. In principle any of the fluorescent emitter and fluorescent host known to one skilled in the art can be employed in formulations according to the present invention. Preferably, the fluorescent emitter and host materials are selected from the fluorescent emitter and fluorescent host materials as described in the present application.

In a preferred embodiment of the present invention the fluorescent host material is selected from anthracenes, benzanthracenes, indenofluorenes, fluorenes, spirobifluorenes, phenanthrenes, dehydrophenanthrenes, thiophenes, triazines, imidazole and derivatives thereof.

Further preference is given to phosphorescent emitter and phosphorescent host materials. Another subject of the present invention is, therefore, an formulation, characterized in that it comprises at least one phosphorescent emitter and at least one host material. Perferably, the phosphorescent emitter and the host material exhibit a high solubility in one solvent, preferably, the second organic solvent (S-2). Preferably the formulation comprises 3 phosphorescent emitter materials and one host material, particularly preferably it comprises 2 phosphorescent emitter and one host material, and very particularly preferably it comprises one phosphorescent emitter and one host material.

The formulation according to the invention may also comprise one or more additional hosts, so called co-hosts. In principle any of the phosphorescent emitter and hosts known to one skilled in the art can be employed in formulations according to the present invention. Preferably, the phosphorescent emitter and host materials are selected from the phosphorescent emitter and phosphorescent host materials for phosphorescent emission, e.g. from electronically excited triplet or quintet states, as described in the present application.

In a preferred embodiment of the present invention the host for phosphorescent emission is selected from ketones, carbazoles, triaryamines, indenofluorenes, fluorenes, spirobifluorenes, phenanthrenes, dehydrophenanthrenes, thiophenes, triazines, imidazoles and derivatives thereof.

Preferably the said phosphorescent emitter is selected from metal complexes comprising metal selected from the group consisting of transition metals, rare earth, lanthanide and actinide, and preferably selected from the group consisting of Ir, Ru, Os, Eu, Au, Pt, Cu, Zn, Mo, W, Rh, Pd and Ag; and the said host is preferrably selected from compounds comprising ketone, carbazole, triaryamine, indenofluorenes, fluorenes, spirobifluorenes, phenanthrenes, dehydrophenanthrenes, phosphine, phosphinoxide, thiophenes, triazines, imidazole and derivatives thereof.

In another preferred embodiment, the said formulation comprises at least two phosphorescent emitters and one host material. Very preferably, the absorption spectrum of the one phosphorescent emitter overlaps with the photoluminescence of the other phosphorescent emitter, therefore FOrster energy transfer may be preferably occur between the two phosphorescent emitters. Further preferably, the one phosphorescent emitter emits blue-green light and the second one green or red light.

The present invention further relates to a formulation, characterized in that the formulation comprises at least one electron transport material.

Preferably the formulation according to the invention comprises 3 ETMs, particularly preferably 2 ETMs, and very particularly preferably one ETM. In principle any of the ETMs known to one skilled in the art can be employed in formulations according to the present invention. Preferably, the ETMs are selected from the ETMs as described in the present application.

Preferred ETM are selected from imidazoles, pyridines, pyrimidines, pyridazines, pyrazines, oxadiazoles, chinolines, chinoxalines, anthracenes, benzanthracenes, pyrenes, perylenes, benzimidazoles, triazines, ketones, phosphine, phosphinoxides, phenazines, phenanthrolines, triarylboranes and derivatives thereof.

The present invention further relates to a formulation, characterized in that the formulation comprises at least one electron injection material. Preferably the formulation according to the invention comprises 3 EIMs, particularly preferably 2 EIMs, and very particularly preferably one EIM. In principle any of the EIMs known to one skilled in the art can be employed in formulations according to the present invention. Preferably, the EIMs are selected from the EIMs as described in the present application.

Preferred EIM are selected from imidazoles, pyridines, pyrimidines, pyridazines, pyrazines, oxadiazoles, chinolines, chinoxalines, anthracenes, benzanthracenes, pyrenes, perylenes, benzimidazoles, triazines, ketones, phosphine, phosphinoxides, phenazines, phenanthrolines, triarylboranes and derivatives thereof.

The present invention further relates to a formulation, characterized in that the formulation comprises at least one hole transport material. Preferably the formulation according to the invention comprises 3 HTMs, particularly preferably 2 HTMs, and very particularly preferably one HTM. In principle any of the HTMs known to one skilled in the art can be employed in formulations according to the present invention. Preferably, the HTMs are selected from the HTMs as described in the present application.

Preferred HTMs are selected from amines, triarylamines, thiophenes, carbazoles, phthalocyanines, porphyrines and derivatives thereof.

The present invention further relates to a formulation, characterized in that the formulation comprises at least one hole injection material. Preferably the formulation according to the invention comprises 3 HIMs, particularly preferably 2 HIMs, and very particularly preferably one HIM. In principle any of the HIMs known to one skilled in the art can be employed in formulations according to the present invention. Preferably, the HIMs are selected from the HIMs as described in the present application.

Preferred HTMs are selected from amines, triarylamines, thiophenes, carbazoles, phthalocyanines, porphyrines and derivatives thereof.

The present invention further relates to a formulation, characterized in that the formulation comprises at least one metal complex. Preferably the formulation according to the invention comprises 3 metal complexes, particularly preferably 2 metal complexes, and very particularly preferably one metal complex. In principle any of the metal complexes known to one skilled in the art can be employed in formulations according to the present invention. Preferably, the metal complexes are selected from the metal complexes described in the present application.

Preferred metal complexes are selected from transition metals, rare earth, lanthanide and actinide. Particularly preferred metal complexes comprise metals delected from Ir, Ru, Os, Eu, Au, Pt, Cu, Zn, Mo, W, Rh, Pd, and Ag.

The present formulation can be obtained by mixing at least two solvents with at least two semiconducting organic compounds.

Yet another embodiment of the present invention is a preferred method for the preparation of a formulation according to the present invention comprising the following steps:
a) mixing a first semiconducting organic compound (OSC-1) with a first solvent (S-1)
b) mixing a second semiconducting organic compound (OSC-2) with a second solvent (S-2)
c) mixing the composition obtained in step a) with the composition obtained in step b).

Layer structures are crucial for various organic electronic or opto-electronic devices. The present invention further relates to a method for preparing a multilayer structure using the formulation according to the present invention.

The preferred method comprises the following steps:
a) depositing the formulation according to the invention onto a substrate to form a film or layer,
b) removing said first organic solvent (S-1) thereby forming a layer comprising said first organic semiconducting compound (OSC-1), and
c) removing said second organic solvent (S-2) thereby forming a layer comprising said second organic semiconducting compound (OSC-2).

Regarding the formation of the two layers, the following aspects could be considered as useful hints for a person skilled in the art:

By evaporation of the solvent in step b) as mentioned above the ratio of the solvents in the blend changes due to the difference in boiling points. This changes solubility profile of the solvent blend and the OSC-1 is left in an environment where it is insoluble and the bottom layer is thus formed from OSC-1.

In step c), the solvent blend is rich in S2 which favours OSC-2 solubility and as this evaporates a second layer (OSC-2) is formed on top of OSC-1.

In the said method, the layer can be coated from solution by a coating technique, which can be selected from spin-coating, or printing techniques such as ink-jet printing, screen printing, slot printing, nozzle printing, etc.

In a further preferred embodiment of the present invention the method for the preparation of a multi layer structure as described above is characterized in that at least one additive is added to the formulation.

Preferably 3, particularly preferably 2, and very particularly preferably 1 additive is added to the formulation.

The preferred function of the additive is the modification of physical properties in order to facilitate the preparation of multi layer structures.

Particularly preferably the additive modifies the surface tension of the formulation in order to enable film formation. A typical problem in context with the preparation of a multilayer structure is the wetting of the solution or emulsion on the underneath layer. Therefore, it is necessary to modify the solution or emulsion, for example its surface tension, before its use. It can be achieved by adding additional additives, for example wetting agents, dispersing agents, hydrophobing agents, adhesive agents etc. Further suitable additive can be referred to for example WO 2003/019693 A2.

The important parameters for deposition techniques from solution or emulsion are for example viscosity, surface tension, concentration, molecular weight of the solution, and particle size of the emulsion, boiling point of solvent, etc.. Indeed, different deposition techniques demand different parameters. For the most widely used techniques, spin-coating and inkjet printing, they have some parameters in common; for example, they demand a viscosity of 1 to 12 mPas, and surface tension <40 mN/m, particles with a size of ≤0.22 μm, and boiling point of solvent from 70 to 300° C., though the optimal condition may be different from each other depending on the method and the substrate used.

It is important to adjust the above mentioned parameter of the solution or emulsion in a desired corridor. This can be achieved by adding different additives.

In further another embodiment, the present invention relates to a coating method using the formulation as described above and below. It is desirable to generate small structures or patterns in modern microelectronics to reduce cost (more devices/unit area), and power consumption. Solution deposition methods are especially preferred. Preferred deposition techniques include, without limitation, dip coating, spin coating, ink jet printing, letter-press printing, screen printing, doctor blade coating, roller printing, reverse-roller printing, offset lithography printing, flexographic printing, web printing, spray coating, brush coating or pad printing, slot-die coating. Ink-jet printing is particularly preferred as it allows high resolution displays to be prepared.

Selected formulations according to the present invention may be applied to prefabricated device substrates by ink jet printing or microdispensing. Preferably industrial piezoelectric print heads such as but not limited to those supplied by Aprion, Hitachi-Koki, InkJet Technology, On Target Technology, Picojet, FujiFilm Dimatix, Trident, Xaar may be used to apply the organic functional material layer to a substrate. Additionally semi-industrial heads such, as those manufactured by Brother, Epson, Konica, Seiko Instruments Toshiba TEC or single nozzle microdispensers such as those provided by Microdrop and Microfab may be used.

Moreover, the method for the preparation of a multilayer structure according to the invention may be used to produce electronic and opto-electronic devices, which is an embodiment of the present invention.

The present invention also relates to the use of a formulation according to the present invention as coating or printing ink for the preparation of OE devices.

Preferably the formulation according to the present invention may be used in opto-electronic devices, in which the absorption or emission of electromagnetic radiation preferably in the ultraviolet, visible or infrared part of the spectrum, plays a crucial role, such as light emitting devices, light sensors or light harvesting devices (e.g. photovoltaic cells).

Preference is given to the use of formulations according to the present invention in electronic and opto-electronic devices selected from organic light emitting diodes (OLEDs), polymer light emitting diodes (PLEDs), fiber OLEDs, organic light emitting electrochemical cells (OLECs), organic field effect transistors (OFETs), thin film transistors (TFTs), organic solar cells (O-SCs), dye-sensitised solar cells (DSSCs), organic laser diodes (O-laser), organic integrated circuits (O-IC), radio frequency identification (RFID) tags, photodetectors, sensors, logic circuits, memory elements, capacitors, charge injection layers, Schottky diodes, planarising layers, antistatic films, conducting substrates or patterns, photoconductors, electrophotographic elements, organic light emitting transistors (OLETs), organic spintronic devices, and organic plasmon emitting devices (OPEDs).

The invention further relates to an electronic or opto-electronic device obtained by a method according to the invention. Preferably the device is selected from organic light emitting diodes (OLEDs), polymer light emitting diodes (PLEDs), fiber OLEDs, organic light emitting electrochemical cells (OLECs), organic field effect transistors (OFETs), thin film transistors (TFTs), organic solar cells (O-SCs), dye-sensitised solar cells (DSSCs), organic laser diodes (O-laser), organic integrated circuits (O-IC), radio frequency identification (RFID) tags, photodetectors, sensors, logic circuits, memory elements, capacitors, charge injection layers, Schottky diodes, planarising layers, antistatic films, conducting substrates or patterns, photoconductors, electrophotographic elements, organic light emitting transistors (OLETs), organic spintronic devices, and organic plasmon emitting devices (OPEDs). Particularly preferably the device is a OLED, and an OSCs.

It is usually an advantage to have a plurality of organic functional materials within a device, either in the same layer or in two adjacent layers, forming a heterojunction either in between the layers or a bulk heterojunction in the layer (see FIG. 1). Such heterojunctions can be classified into 2 classes: type I, in which the LUMO and HOMO levels of one material (material A) lie within the LUMO-HOMO energy gap of the second material (material B), as illustrated on the left hand side of FIG. 1, and type II, in which the minimum energy difference between the highest HOMO state and the lowest LUMO state is between levels on different sides of the heterojunction, as illustrated on the right hand side of FIG. 1. Electrons tend to occupy the energetically lowest LUMO level, whereas holes tend to occupy the energetically highest HOMO level. Thus, in a type I heterojunction electrons and holes are located on the same side of the junction and in a type II heterojunction both electrons and holes are located on different sides of the junction. However, because in organic semiconducting materials, the exciton binding energy is usually assumed to be 0.5 eV or more, the band offset of type II is necessarily bigger than about 0.5 eV to ensure the efficient excition dissociation at the heterojunction, which is an important issue particularly for organic solar cells.

Preference is given to an OLED which is prepared by using at least one formulation according to the present invention, wherein said formulation comprises at least two organic semiconducting material as outlined above.

A typical sequence of layers as found in an OLED and OSC is, for example:
  optionally a first substrate,
  an anode layer,
  optionally a hole injection layer (HIL),
  optionally a hole transport layer (HTL) and/or an electron blocking layer (EBL),
  an active layer, which upon electrical or optical exciation, produces excitons,
  optionally an electron transport layer (ETL) and/or a hole blocking layer (HBL),
  optionally an electron injection layer (EIL),
  a cathode layer,
  optionally a second substrate.

The sequence of the given layer structure is exemplary. Other sequences are possible. Depending on the active layers in the above mentioned device, different opto-electronic devices will be obtained. In a first preferred embodiment, the active layer generates excitons upon electrical excitation through applying voltage between anode and cathode, and further emits light through radiative decay of the excitons. In general, this is called light emitting device. In another preferred embodiment, the active layer generates exciton through absorbing light, and further produces free charge carrier through exciton dissociation. In general, this is called photovoltaic or solar cell.

Figure 2:
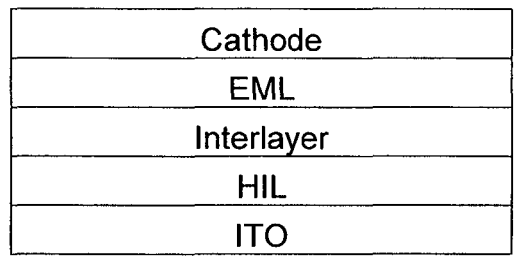
FIG. 2 shows a typical device structure of a polymer light emitting diode (PLED) with interlayer.
Figure 3:
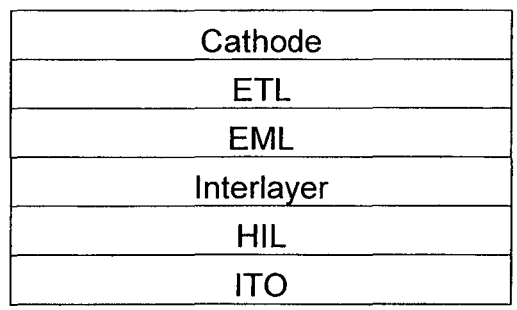
FIG. 3 shows a PLED with an ETL or HMB.

The term interlayer as used herein is defined as layer between the hole injection layer (or buffer layer) and the emissive layer in polymer light emitting diodes (PLEDs), being an electron blocking layer, as disclosed for example in WO 2004/084260 A2. The typical device structure of PLEDs with interlayer is shown in FIG. 2. However one problem with this kind of device is that the interlayer is usually, at least in part, washed away upon coating the EML layer, which leads to a very thin layer. This process is not well-controlled in the prior art. It is highly desired to use ETL or HMB in PLEDs, as shown in FIG. 3, in order to get better confinement of holes and exciton in the EML to achieve high efficiency and lifetime.

In another preferred embodiment, the electronic device of the invention is soluble system based OLEDs, particularly PLEDs as disclosed for example in WO 2004/084260 A2, which comprises the multilayer structure as follows: anode/HIL/EML/Cathode, wherein the double-layer HIL/EML is made by using at leat one method for multilayer structure as described above.

The HIL is usually a transparent conductive polymer thin film comprising HIM. Preferred HIM are those mentioned above. The emissive materials may further comprise a blend or mixture of two or more different emitters, for example two emitters of different type and/or emitters that emit light of different colors. Thus, a device of the present invention may provide white light.

The device structure of the above mentioned further electronic device is clear to the skilled person in the art in the field. Nevertheless, for the sake of clarity, references are made to some detailed device structures.

Organic light emitting electrochemical cells (OLECs) comprise two electrodes, and a mixture or blends of electrolyte and fluorescent species in between, as firstly reported by Pei & Heeger in Science (1995), 269, 1086-1088. I It is preferred here that an OLEC is prepared by using an formulation and the methods described above and below.

The present invention relates also to layer and multilayer structures obtainable by the use of a formulation according to the present invention. The present invention also relates to devices comprising said layer. Preferably the devices are opto-electronic devices as outlined elsewhere in the present invention.

The present invention also relates to devices obtainable by the use of a formulation according to the present invention.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

It will be appreciated that many of the features described above, particularly of the preferred embodiments, are inventive in their own right and not just as part of an embodiment of the present invention. Independent protection may be sought for these features in addition to or alternative to any invention presently claimed.

The teaching as disclosed here can be abstracted and combined with other examples disclosed.

Other features of the invention will become apparent in the course of the following description of exemplary embodiments, which are given for illustration of the invention and are not intended to be limiting thereof.

WORKING EXAMPLES

Example 1

Materials

The formulations described herein are exemplary embodiments of the present invention. The person skilled in the art can, based on the teaching of the present invention, prepare a plurality of further solutions and emulsions comprising organic semiconducting material without being inventive.

The following formulation can be prepared by mixing the following compounds as mentioned below by weight:

| | |
|---|---|
| HM-1 | 1.00% |
| HM-2 | 1.00% |
| TE-1 | 0.50% |
| POL-1 | 0.10% |
| Solvents | 97.40% |

Solvents consisting of:

| | |
|---|---|
| 3-phenoxy toluene | 20.00% |
| Propyl benzene | 80.00% |

Structures of the used OLED materials:

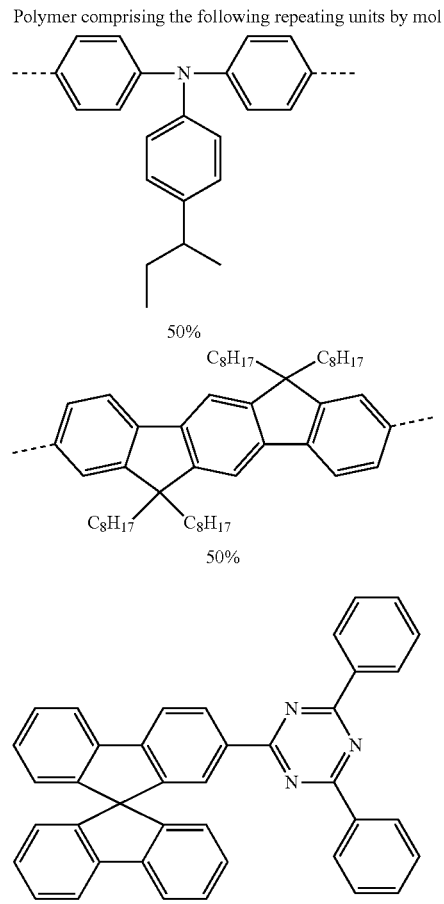

POL-1

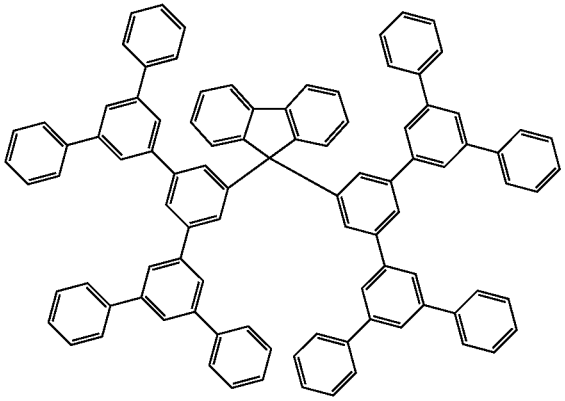

HM-2

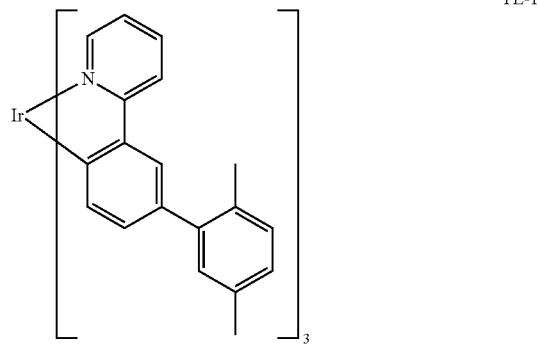

TE-1

The low quantity of POL-1 is designed so that a thin approximately 5nm film will be deposited under the emissive layer. PEDOT is spun coat onto a ITO patterned glass substarte, this is dried and baked at 200C in order to drive all the solvent off.

The formulated ink above is ink-jet printed using a Pixdro LP50 printer with a Fujifilm Dimatix SQ print-head. The resulting film is dried on a hotplate set at 100C over a period of 5 minutes. A cathode is subsequently evap:orated on top and the device is tested electrically.

The completed device has a max efficiency of 11.2 cd/A although a number of black spots are evident in the film resulting in shorts.

The first layer comprising POL-1 has a thickness of about 5 nm. The total thickness of both printed layer is about 90 nm.

The invention claimed is:

1. A formulation comprising a first organic semiconducting compound (OSC-1), a second organic semiconducting compound (OSC-2) and a first organic solvent (S-1) and a second organic solvent (S-2), wherein the first organic solvent (S-1) exhibits a lower boiling point than the second organic solvent (S-2), and the first organic solvent (S-1) has a boiling point in the range of from 100 to 300° C., and wherein the first organic semiconducting compound (OSC-1) has a high solubility in the first organic solvent (S-1) and the first organic semiconducting compound (OSC-1) has a low solubility in the second organic solvent (S-2), and the weight ratio of the first organic solvent (S-1) to the second organic solvent (S-2) is higher than 0.5.

2. The formulation according to claim 1, wherein said first organic semiconducting compound (OSC-1) has a solubility in the second organic solvent (S-2) of at most 5 g/l.

3. The formulation according to claim 1, wherein said first organic semiconducting compound (OSC-1) has a solubility in the first organic solvent (S-1) of at least 10 g/l.

4. The formulation according to claim 1, wherein the second organic semiconducting compound (OSC-2) has a low solubility in the first organic solvent (S-1).

5. The formulation according to claim 1, wherein said first organic semiconducting compound (OSC-1) has a solubility in the second organic solvent (S-2) of at most 5 g/l, and be orthogonal.

6. The formulation according to claim 1, wherein the second organic semiconducting compound (OSC-2) has a high solubility in the second solvent.

7. The formulation according to claim 1, wherein said second organic semiconducting compound (OSC-2) has a solubility in the second organic solvent (S-2) of at least 10 g/l.

8. The formulation according to claim 1, wherein difference between the boiling point of said first organic solvent (S-1) and the boiling point of said second organic solvent (S-2) is at least 10° C.

9. The formulation according to claim 1, wherein at least one of the organic semiconducting compounds has a molecular weight of at most 5,000 g/mol.

10. The formulation according to claim 1, wherein at least one of the organic semiconducting compounds has a molecular weight (Mw) of at least 10,000 g/mol.

11. The formulation according to claim 1, wherein the formulation comprises at least a third organic semiconducting compound (OSC-3) having a high solubility in the second organic solvent (S-2).

12. The formulation according to claim 11, wherein the second organic semiconducting compound (OSC-2) is an emitter, and the third organic semiconducting compound (OSC-3) is an emitter, an electron transport material (ETM), a hole transport material (HTM) and/or a wide band gap compound.

13. The formulation according to claim 1, wherein the second organic semiconducting compound (OSC-2) is an emitter, and wherein the first organic semiconducting compound is a charge transporting compound.

14. The formulation according to claim 1, wherein the second organic semiconducting compound (OSC-2) is an electron transport material (ETM) and/or a hole blocking material (HBM) and wherein the first organic semiconducting is an emitter.

15. The formulation according to claim 1, wherein the second organic semiconducting compound (OSC-2) is an electron injection material (EIM) and wherein the first organic semiconducting is an electron transport material (ETM) and/or a hole blocking material (HBM).

16. A method comprising utilizing the formulation according to claim 1 as coating or printing ink for the preparation of OE devices.

17. A process of preparing an organic electronic (OE) device, comprising the steps of:
   a) depositing the formulation according to claim 1 onto a substrate to form a film or layer;
   b) removing said first organic solvent (S-1) thereby forming a layer comprising said first organic semiconducting compound (OSC-1), and;
   c) removing said second organic solvent (S-2) thereby forming a layer comprising said second organic semiconducting compound (OSC-2).

18. An OE device prepared from a formulation according to claim 1.

* * * * *